United States Patent
Yazami et al.

(10) Patent No.: US 11,848,427 B2
(45) Date of Patent: Dec. 19, 2023

(54) NON-LINEAR VOLTAMMETRY-BASED METHOD FOR CHARGING A BATTERY AND FAST CHARGING SYSTEM IMPLEMENTING THIS METHOD

(71) Applicant: Yazami IP PTE. LTD., Singapore (SG)

(72) Inventors: Rachid Yazami, Singapore (SG); Thannehene Gedara Thusitha Asela Bandara, Singapore (SG)

(73) Assignee: Yazami IP PTE. LTD., Singapore (SG)

( * ) Notice: Subject to any disclaimer, the term of this patent is extended or adjusted under 35 U.S.C. 154(b) by 0 days.

(21) Appl. No.: 16/770,568

(22) PCT Filed: Dec. 7, 2018

(86) PCT No.: PCT/IB2018/059766
§ 371 (c)(1),
(2) Date: Jun. 5, 2020

(87) PCT Pub. No.: WO2019/111226
PCT Pub. Date: Jun. 13, 2019

(65) Prior Publication Data
US 2021/0167621 A1 Jun. 3, 2021

(30) Foreign Application Priority Data
Dec. 7, 2017 (SG) .......................... 10201710151Y

(51) Int. Cl.
*H02J 7/00* (2006.01)
*H01M 10/44* (2006.01)

(52) U.S. Cl.
CPC ............. *H01M 10/44* (2013.01); *H02J 7/007* (2013.01); *H02J 7/0071* (2020.01);
(Continued)

(58) Field of Classification Search
CPC .... H02J 7/007182; H02J 7/0048; H02J 7/005; H02J 7/0071; H02J 7/00718; H02J 7/007184; H02J 7/007194; H02J 7/00712
(Continued)

(56) References Cited

U.S. PATENT DOCUMENTS

| | | | | |
|---|---|---|---|---|
| 4,370,606 A | * | 1/1983 | Kakumoto | ............ H02J 7/0091 320/152 |
| 4,728,807 A | * | 3/1988 | Harafuji | .................... G05F 1/59 307/64 |

(Continued)

FOREIGN PATENT DOCUMENTS

WO 2019/111226 A1 6/2019

OTHER PUBLICATIONS

Bandara et al., Adaptive Charging Protocol (ACP) Based on Non-Linear Voltammetry (NLV) Charging Patterns for Fast Charging Li-Ion Batteries, International Journal of Engineering Science Invention, www.ijesi.org, Bol. 7, Issue 12, Ver. III, (Dec. 2018), pp. 44-58.

(Continued)

*Primary Examiner* — John T Trischler
(74) *Attorney, Agent, or Firm* — TraskBritt

(57) ABSTRACT

A Non-Linear Voltammetry (NLV)-based method for charging batteries. It also relates to a fast charging system implementing this method. Adaptive charging, Non-Linear Voltage changing, and Relaxation are the key cornerstones of this method. Adaptive charging allows the system to balance the charging based on the user's time requirements, required charge capacity and the SOC and SOH of the battery. Non-linearly changing the voltage coupled with a suitable relaxation pattern allows this method to gain the maximum charge capacity without straining the battery.

20 Claims, 20 Drawing Sheets

(52) U.S. Cl.
CPC .... *H02J 7/00718* (2020.01); *H02J 7/007182* (2020.01); *H02J 7/007184* (2020.01); *H02J 7/007194* (2020.01); *H02J 7/005* (2020.01); *H02J 7/0048* (2020.01); *H02J 7/00712* (2020.01)

(58) Field of Classification Search
USPC .......................................................... 320/137
See application file for complete search history.

(56) References Cited

U.S. PATENT DOCUMENTS

| | | | | |
|---|---|---|---|---|
| 5,998,968 | A * | 12/1999 | Pittman | H02J 7/00711 320/145 |
| 6,064,182 | A * | 5/2000 | Eguchi | G01R 31/367 429/93 |
| 6,114,835 | A | 9/2000 | Price | |
| 6,417,668 | B1 * | 7/2002 | Howard | H02J 7/14 324/426 |
| 6,495,992 | B1 * | 12/2002 | Pavlovic | H02J 7/00038 320/161 |
| 6,965,216 | B2 * | 11/2005 | Pavlovic | H02J 7/0069 320/157 |
| 7,245,185 | B2 * | 7/2007 | Litovsky | H02J 7/345 330/297 |
| 7,595,611 | B2 * | 9/2009 | Reynier | H01M 10/42 320/152 |
| 8,160,834 | B2 * | 4/2012 | Liang | A61B 5/14865 702/65 |
| 8,446,127 | B2 * | 5/2013 | Yazami | H02J 7/007 320/152 |
| 8,901,892 | B2 * | 12/2014 | Yazami | H02J 7/007 320/152 |
| 9,065,292 | B2 * | 6/2015 | Yazami | H02J 7/007184 |
| 9,229,510 | B2 * | 1/2016 | Chiueh | H01M 10/42 |
| 9,285,433 | B2 * | 3/2016 | Kurimoto | B60L 58/13 |
| 9,321,368 | B2 * | 4/2016 | Yang | G01R 31/367 |
| 9,397,516 | B2 * | 7/2016 | Hunter | H02J 7/00712 |
| 9,461,492 | B1 * | 10/2016 | Berkowitz | H02J 7/00 |
| 9,539,912 | B2 * | 1/2017 | Li | B60L 58/13 |
| 9,551,759 | B2 * | 1/2017 | Yazami | H01M 10/4257 |
| 9,599,584 | B2 * | 3/2017 | Yazami | B60L 58/18 |
| 9,720,046 | B2 * | 8/2017 | Tazoe | G01R 31/3842 |
| 9,995,794 | B2 * | 6/2018 | Yazami | G01R 31/367 |
| 10,067,198 | B2 * | 9/2018 | Maluf | H02J 7/0048 |
| 10,205,401 | B1 * | 2/2019 | Nikitin | H02M 7/53875 |
| 10,302,703 | B2 * | 5/2019 | Fleischer | G01R 31/3842 |
| 10,353,003 | B2 * | 7/2019 | Stulrajter | G01R 27/08 |
| 10,447,055 | B1 * | 10/2019 | Berkowitz | H02J 7/0077 |
| 10,556,510 | B2 * | 2/2020 | Yazami | B60L 58/12 |
| 2003/0094927 | A1 * | 5/2003 | Pavlovic | H02J 7/0069 320/162 |
| 2003/0206021 | A1 * | 11/2003 | Laletin | G01R 31/386 324/426 |
| 2004/0119445 | A1 * | 6/2004 | Wakeman | G01R 31/3835 320/156 |
| 2004/0128089 | A1 * | 7/2004 | Barsoukov | G01R 31/389 702/65 |
| 2007/0182418 | A1 * | 8/2007 | Reynier | H01M 10/60 324/429 |
| 2009/0110214 | A1 * | 4/2009 | Litovsky | H02J 7/00047 381/104 |
| 2009/0234601 | A1 * | 9/2009 | Wu | G01R 31/2603 702/64 |
| 2010/0090650 | A1 * | 4/2010 | Yazami | G01R 31/382 324/426 |
| 2010/0169035 | A1 * | 7/2010 | Liang | A61B 5/14865 702/65 |
| 2011/0230741 | A1 * | 9/2011 | Liang | A61B 5/14532 702/65 |
| 2012/0043929 | A1 * | 2/2012 | Yazami | H02J 7/007184 320/160 |
| 2012/0098481 | A1 * | 4/2012 | Hunter | H02J 7/00712 703/13 |
| 2012/0306450 | A1 * | 12/2012 | Nakayama | G01R 31/367 320/134 |
| 2013/0090872 | A1 * | 4/2013 | Kurimoto | G01R 31/392 702/63 |
| 2013/0271089 | A1 * | 10/2013 | Yazami | H01M 10/48 320/162 |
| 2013/0322488 | A1 * | 12/2013 | Yazami | B60L 58/15 374/100 |
| 2014/0157034 | A1 * | 6/2014 | Chiueh | G06F 1/26 713/340 |
| 2014/0354233 | A1 * | 12/2014 | Yazami | G01R 31/387 324/426 |
| 2014/0375275 | A1 * | 12/2014 | Hung | B60L 53/11 320/139 |
| 2015/0231986 | A1 | 8/2015 | Li | |
| 2015/0377976 | A1 | 12/2015 | Maluf et al. | |
| 2015/0377977 | A1 * | 12/2015 | Yazami | H01M 10/48 324/426 |
| 2016/0052418 | A1 * | 2/2016 | Yang | B60L 58/12 180/65.265 |
| 2016/0064979 | A1 * | 3/2016 | Huang | H02J 7/0045 320/114 |
| 2016/0084913 | A1 * | 3/2016 | Lupo | G01R 31/3842 702/63 |
| 2016/0146895 | A1 * | 5/2016 | Yazami | H02J 7/0047 324/426 |
| 2018/0196107 | A1 * | 7/2018 | Fleischer | G01R 31/3842 |
| 2019/0036367 | A1 | 1/2019 | Sultenfuss et al. | |
| 2019/0305674 | A1 * | 10/2019 | Liu | H02M 1/15 |
| 2020/0143982 | A1 * | 5/2020 | Rochford | H02J 50/12 |
| 2020/0227221 | A1 * | 7/2020 | Reuber | H01H 33/593 |
| 2021/0055353 | A1 * | 2/2021 | Yazami | G01R 31/367 |
| 2021/0057926 | A1 * | 2/2021 | Yazami | G01R 31/3842 |
| 2021/0091421 | A1 * | 3/2021 | Yazami | H01M 10/4257 |
| 2021/0167620 | A1 * | 6/2021 | Yazami | H01M 10/44 |
| 2021/0208208 | A1 * | 7/2021 | Yazami | H01M 10/425 |

OTHER PUBLICATIONS

International Search Report for International Application No. PCT/IB2018/059766 dated Mar. 22, 2019, 4 pages.
International Written Opinion for International Application No. PCT/IB2018/059766 dated Mar. 22, 2019, 8 pages.
Andrea, David, Battery Management Systems for Large Battery Packs, ISBN-13 978-1-60807-104-3, (2010), Chapter I, 28 pages.
Ansean et al., Efficient Fast-Charging Strategies for Li-Ion Batteries, Conference: EVS28 International Electric Vehicle Symposium and Exhibition—Kintex, Korea, (May 3-6, 2015), 11 pages.
Ayoub et al., Review on the Charging Techniques of a Li-ion Battery, 2015 Third International Conference on Technological Advances in Electrical, Electronics and Computer Engineering (TAEECE), (Apr. 29-May 1, 2015), 7 pages.
Baroody et al., Evaluation of Rapid Electric Battery Charging Techniques, UNLV Theses, Dissertations, Professional Papers, and Capstones, (2009), https://digitalscholarship.unlv.edu/cgi/viewcontent.cgi?article=1162&context=thesesdissertations, 68 pages.
Bazant, Martin Z., Theory of Chemical Kinetics and Charge Transfer Based on Nonequilibrium Thermodynamics, Accounts of Chemical Research, Acc. Chem. Res. (2013), 46, 5, 1144-1160.
He et al., *-Aware Charging of Lithium-ion Battery Cells, IEEE, https://rtcl.eecs.umich.edu/rtclweb/assets/publications/2016/StarAware-ICCPS16.pdf, Proceedings of the 7th International Conference on Cyber-Physical Systems, (Apr. 2016), Article No. 26, pp. 1-10.
Hu et al., Estimation of State of Charge of Lithium-Ion Battery Pack for Electric Vehicles using an Adaptive Luenberger Observer, www.mdpi.com/journal/energies, Energies, (2010), vol. 3, pp. 1586-1603.
International Search Report for International Application No. PCT/IB2018/059756 dated Jul. 30, 2019, 4 pages.
International Written Opinion for International Application No. PCT/IB2018/059756 dated Jul. 30, 2019, 9 pages.

(56) References Cited

OTHER PUBLICATIONS

Jiang et al., An Optimal Charging Method for Li-Ion Batteries using a Fuzzy-Control Approach Based on Polarization Properties, IEEE Transactions on Vehicular Technology, vol. 62, No. 7, (Sep. 2013), pp. 3000-3009.

Jiang et al., An Optimal Charging Method for Li-Ion Batteries Using a Fuzzy-Control Approach Based on Polarization Properties, Transactions on Vehicular Technology, vol. 62, Issue 7, (Sep. 2013), abstract only.

Jiang et al., Evaluation of Acceptable Charging Current of Power Li-Ion Batteries Based on Polarization Characteristics, IEEE Transactions on Industrial Electronics, vol. 61, No. 12, (Dec. 2014), pp. 6844-6851.

Kim, Il-Song, The Novel State of Charge Estimation Method for Lithium Battery using Sliding Mode Observer, Journal of Power Sources, vol. 163, (2006), pp. 584-590.

Ramadesigan et al., Modeling and Simulation of Lithium-Ion Batteries from a Systems Engineering Perspective, Journal of the Electrochemical Society, (2012), vol. 159, No. 3, pp. R31-R45.

Xiong et al., Critical Review on the Battery State of Charge Estimation Methods for Electric Vehicles, IEEE Access, vol. 6, (2018), pp. 1832-1843.

Zhang, Sheng Shui, The Effect of the Charging Protocol on the Cycle Life of a Li-ion Battery, Journal of Power Sources, vol. 161, (2006), pp. 1385-1391.

Machine Translation of WO 2011/162014, 37 pages (Year: 2011).

\* cited by examiner

Capacity Gain during "$x^{th}$" second is considered as:
$C_{gain} = I_{x+1} * (2)/ 3600$ [mAh, "I" in mA

NON-LINEAR VOLTAMMETRY-BASED METHOD FOR CHARGING A BATTERY AND FAST CHARGING SYSTEM IMPLEMENTING THIS METHOD

CROSS-REFERENCE TO RELATED APPLICATIONS

This application is a national phase entry under 35 U.S.C. § 371 of International Patent Application PCT/IB2018/059766, filed Dec. 7, 2018, designating the United States of America and published as International Patent Publication WO 2019/111226 A1 on Jun. 13, 2019, which claims the benefit under Article 8 of the Patent Cooperation Treaty to Singapore Patent Application Serial No. 10201710151Y, filed Dec. 7, 2017.

TECHNICAL FIELD

The present disclosure relates to a Non-Linear Voltammetry (NLV)-based method for charging batteries. It also relates to a fast charging system implementing this method.

BACKGROUND

"How to charge a battery faster?" is a question that was not fully answered for several decades since the inception of battery storage devices. More importantly charging a lithium-ion battery faster has become a critical concern due the rapid and massive use of mobile device technologies and the increasing demand on the electric vehicles (EVs) and plugin electric hybrid vehicles (PHEVs) in recent years due to the urgency to curb the air pollution caused by petroleum-dominant vehicles. Therefore, a fast charging solution for a Lithium-Ion battery in today's world is a billion-dollar worth innovation.

The aim of the present disclosure is to propose a new Non-Linear Voltammetry (NLV)-based charging protocol, which allows fast charging for batteries with improved performances compared to present constant current constant voltage (CCCV) fast charging technologies.

BRIEF SUMMARY

According to the present disclosure, the method for charging a battery system, comprises:
a. measuring a plurality of battery system voltages, 'v'
b. measuring a plurality of battery system charging current, T
c. measuring a plurality of battery system temperatures, 'T'
d. measuring the charge time, $t_{Ch}$
e. measuring a plurality of battery system state of charge, SOC
f. measuring a plurality of charge-discharge cycle number, 'n'
g. applying a relationship such as:

$$K = \frac{\partial v}{\partial t} \left| \frac{\partial i}{\partial t} \right|^\alpha$$

where $$\frac{\partial v}{\partial t}$$

is the time increase rate of voltage (V·s$^{-1}$)

$$\left| \frac{\partial i}{\partial t} \right|$$

is the absolute value or the rate of charge current (mA·s$^{-1}$)
K is a variable parameter, 0.006≤K≤300
α is an adjustable constant 0.01≤α≤100

According to another aspect of the present disclosure, it is proposed a battery charging system comprising:
h. sensors for measuring a plurality of the battery system voltages, V
i. sensors for measuring a plurality of the battery system currents, 'i'
j. sensors for measuring a plurality of the battery system temperatures, 'T'
k. sensors for measuring a plurality of the battery system voltages, V
l. sensors for measuring a plurality of the battery system charging time, '$t_{ch}$'
m. a computing system for measuring the battery system state of charge, SOC
n. a computing system for measuring the battery system charge-discharge cycle number
o. a computing system for applying a relationship such as:

$$K = \frac{\partial v}{\partial t} \left| \frac{\partial i}{\partial t} \right|^\alpha,$$

where $$\frac{\partial v}{\partial t}$$

is the time increase rate of voltage (V·s$^{-1}$)

$$\left| \frac{\partial i}{\partial t} \right|$$

is the absolute value of the rate of charge current (mA·s$^{-1}$)
K is a variable parameter, 0.006≤K≤300
α is an adjustable constant 0.01≤α≤100

The battery system can comprise one cell or of a multi-cell system, and can be arranged in series and/or in parallel cell configuration.

The voltage of a cell is, for example, comprised between 2V and 5 V, and the charging current in a cell can be comprised between 0 and 10C (nC rate is defined as the constant charging current to enable a full charging time in $$\frac{1}{n} \text{ hour(s)},$$

i. e. under 10C rate the charging time is $$\frac{1}{10}\text{hour} = 6 \text{ minutes}\bigg).$$

The cell temperature T can be comprised between −20° C. and +55° C. and the charging time $t_{ch}$ from 0% SOC to 100% SOC is comprised between 10 minutes and 2 hours. The SOC can be comprised between 0% and 100% and the cycle number is 200<n<2000.

A Non-Linear Voltammetry (NLV)-based adaptive charging protocol (ACP) for fast charging lithium-ion battery was developed to charge a battery in about 10 minutes time. This is a combination of two fast charging methods that can be applied to any type of battery. It works as memory-less charging model as well as a memory-based charging model. If the historical data about the battery chemistry is available, this protocol automatically gets adjusted to make use of them to provide the best charging performance.

If it happens to charge a random battery, without any historic or specific data, a quick learning model about its ΔSOC will be fair enough to charge it quickly and safely. Not only that, it will also consider about the user's requirements and some system requirements (as and when it detects them) when adjusting its protocol for charging. Therefore, this can also be considered as a universal protocol to fast charging batteries.

Using this method, a battery can be fully charged in about 10 mins time. In average cases, it will charge the battery in about 22-24 minutes time. Through a cyclic test, it has proven that this charging protocol hasn't largely impacted on the capacity fading. Further, this could be a model for fast-charging any type of battery as the basis of this protocol is to let the battery charge with its' own favorable current at any point of time, depending on its ΔSOC and SOH.

Adaptive charging, Non-Linear Voltage changing, and Relaxation are the key cornerstones of this protocol. Adaptive charging allows the system to balance the charging based on the user's time requirements, required charge capacity and the SOC and SOH of the battery. Non-linearly changing the voltage coupled with a suitable relaxation pattern allows this method to gain the maximum charge capacity without straining the battery. As the cell impedance increases toward the end-of-discharge (EOD) [1], the protocol uses either a high-speed NLV steps or a configurable constant current (CC) charge at the starting SOC. If the system couldn't reach the expected charge at the end of the NLV based charging, the adaptive protocol will decide whether to get use of another CC charge to gain the balance capacity. Following summarizes the NLV charging:

The NLV-based charging protocol of the present disclosure can also be applied in combination with other fast charging protocols such as with Constant Current protocol (CC), Constant Current Constant Voltage protocol (CCCV) and with the Cascade Pulse Charging Protocol described in PCT application #PCTIB2018/059705.

BRIEF DESCRIPTION OF THE DRAWINGS

These and other features and advantages of the present disclosure will become better understood with regards to the following description, appended claims, and accompanying drawings wherein:

DETAILED DESCRIPTION

Figure 1:
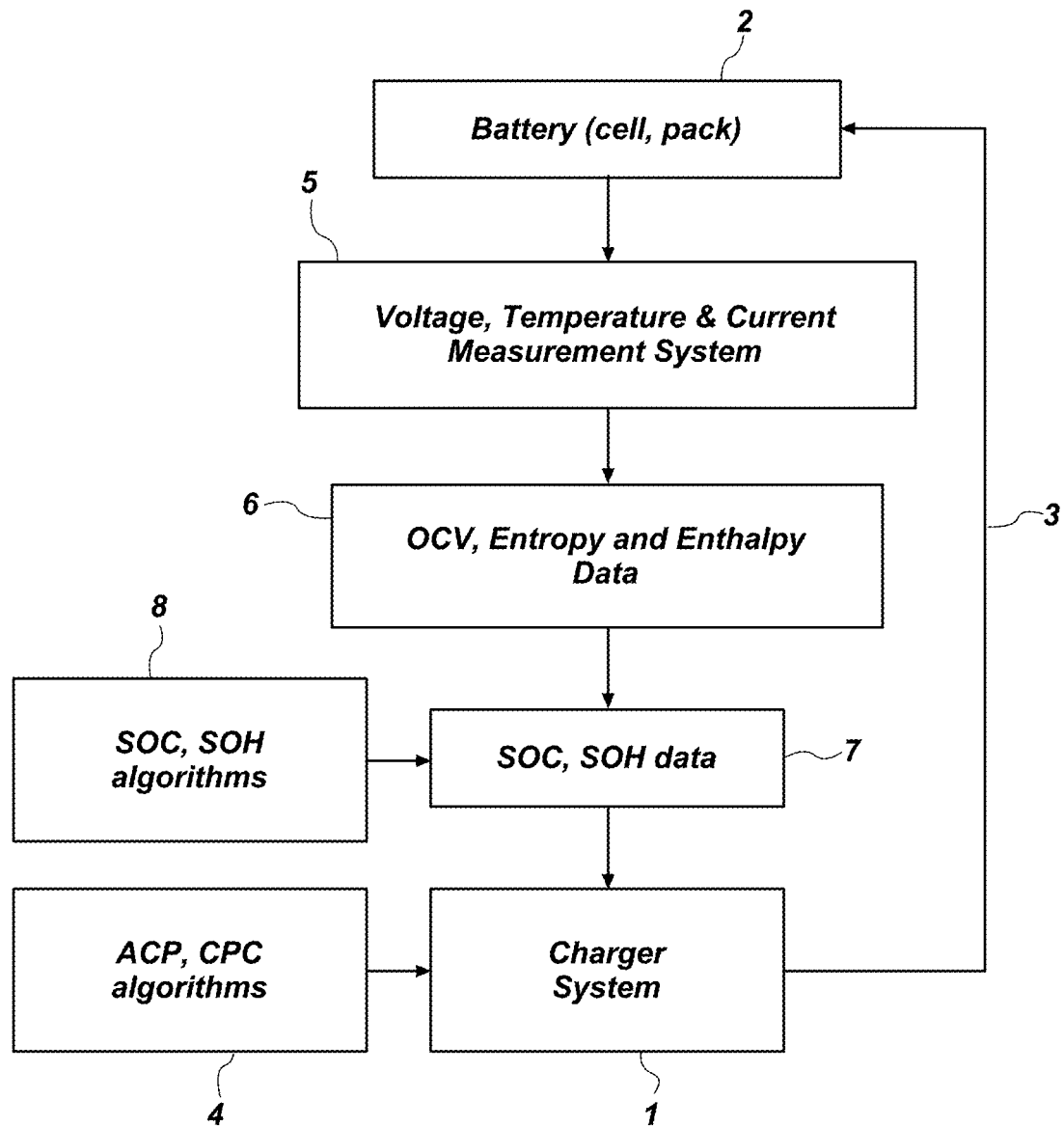
FIG. 1 is a functional scheme of a fast-charging system implementing the adaptive charging protocol according to the present disclosure.

This adaptive charging protocol (ACP) is based on non-linear voltammetry (NLV) based control over the period of charging a battery. It allows the battery to charge at an acceptable Current (Amps) amount at different Voltage levels based on its own state of health (SOH) and state of charge (SOC). Therefore, the amount of Current draws into the battery is never controlled or imposed by this protocol at any time.

Even it is predictable that a battery can be charged (more than 80%) in less than a 25 mins using this method, it may get elongated or shorten based on the health (SOH) of the battery at the time of charging. It also assures better safety compared to the other fast charging methods [2, 3, 5], which are mostly imposing the High-Current (I) in different patterns/wave forms. So, most importantly this ACP method does not strain the battery by drawing a large fixed-load of electrons through the cells without taking its health into consideration.

The equilibrium in kinetics of battery-particle dynamics, such as lithiation/de-lithiation (intercalation/de-intercalation), shooting/floating the ions/electrons through the solvents & separators, transporting charge against the internal impedance (IR) etc. [4, 6], determine how healthy the battery is?/how much of a Current can be taken/given by the battery-system at a time, during charging/discharging? It is believed that this equilibrium can be expressed as a relationship between the "Rate of the change, in Current $$\left(\frac{\partial I}{\partial t}\right)$$

" and the "Rate of the change, in Voltage $$\left(\frac{\partial v}{\partial t}\right).$$

" Therefore, the following relationship was used in forming up this protocol:

$$K_n = \frac{\partial v}{\partial t}\left|\frac{\partial I}{\partial t}\right|^\alpha$$

where:

$K_n$: "K-value" is a constant for a certain period during charging, n>=0

$\frac{\partial v}{\partial t}$ (volts/secs):

This is the rate of the change of Voltage (V) during the charging process [(Vstep-end−Vstep-start)/Step-Time Duration].

$\left|\frac{\partial I}{\partial t}\right|$ (mA/secs):

This is the absolute value of the rate of the change of Current (I) during the charging process.

α: This is an adjustable coefficient 0<a<100 and it makes the room for this equation to seek the non-linear relations between Current & Voltage based on different types of battery. This will also be trained by the system to best suit the charging process.

Further, the relationship for α=1 can be simplified as:

$$K_n = \frac{\partial v}{\partial t}\left|\frac{\partial I}{\partial t}\right|$$

From the literature of Li-ion batteries, it is evident that the chemistries of the battery provide inherent characteristics on the voltage profiles. Within certain lower voltages (with low SOC), the cells tempt to draw a very low Current (due to high impedance) whereas in higher voltages (high SOC with lower polarization) the potential of drawing High Current is remarkably high [1]. Some cells have a very narrow frame of a Voltage-range where these High Currents could be tolerated. So, the fast charging should be applied to keep the battery in these ranges for a longer time, as much as possible, until the expected capacity (as much capacity as possible before the tolerable current drops below a certain lower level, which would elongate the total charge time) is gained during the charging process.

All examples given below are related to lithium ion batteries. However, ACP applies to all types of rechargeable batteries including, and not limited to Solid State Lithium, NiMH, NiCd, LAB, alkaline cells, NaS, NaNiCh, redox flow (ZnBr, VRB), . . . .

The "ACP on NLV" is meant for an Adaptive Charging Protocol (ACP) based on Non-Linear Voltammetry (NLV) charging. It is adaptive as the protocol adapts to several user-driven and system/battery-driven factors to adjust its own charging profile to better response to the given charging requirements. The user expected charging time (duration), expected percentage of charge (100%, 80% or 60% etc.), possible relaxation time and initial state of charge (SOC) are some of the user driven factors of the adaptation process. Identifying current SOC has also designed to be processed automatically using the entropy and enthalpy-based method, which comes as a system/battery driven factor as well. The state of the health (SOH), stated (nominal) capacity, safety voltage range, available accuracy of voltage control and polarization profile of the battery are some of the automatically detected/system driven factors.

During NLV charging, the battery cell set to a certain voltage (CV), which is non-linearly changing and gradually increasing at every step. Therefore, the battery is charged based on Non-Linear-Voltage (NLV) for a period over a series of quick charging steps.

During each of these steps, the cell draws a certain amount of Current based on both of its State of Charge (SOC) and State of Health (SOH) at the very specific time. Then the Current will gradually drop down. How fast the current drops at a certain step provides some clue on how good or bad the battery would like to stay in that NLV step. This way, one can allocate more step-time whenever the battery is keen to draw more Current, and less step-time when it attempts to drastically drop its drawing Current.

After every step, a very short relaxation with zero (0) Current is applied to the system to stabilize with its new charge and thus the OCV will drops to its stable (or almost stable) level. This creates a better chance [7, 8] for the next NLV charge-step to gain the optimal Current based on its status without imposing a high current beforehand. In this way, the protocol trains the cell to be stable and healthy (as much as possible, also without wasting much time on too long relaxation) after every step and better prepare it for the next step to gain more current than if it was done without the relaxation. But, if the amount of current-drop is not significant for a certain step, the system allows to stay longer in that step without moving to the next step. In this case, the rate of current-drop and a maximum allowed time for such continuation of a step is monitored to decide the time to move to the next step.

The system decides the "maximum allowed time for such continuation of a step" based on adaptation parameters. So, whenever a rapid drop of the current or exceeding of the "maximum allowed time for a step" is detected, the system moves to the next charging step. Therefore, the actual time it takes for a full-charge depends on both the SOC and SOH of the battery.

Further, the charging system takes three parameters to determine the end of charging. First, if the battery is fully charged based on the stated and gained capacities. The Second is if the maximum-target-end-voltage is reached. The "target-end-voltage" is adjusted automatically by the system based on the polarization data of the relevant battery type/chemistry. The Third, and optional, factor is a self-learning model of the charging profile to determine the state of charge based on the real-time parameters at the time (by examining for a certain window of time) of charging.

Figure 2:
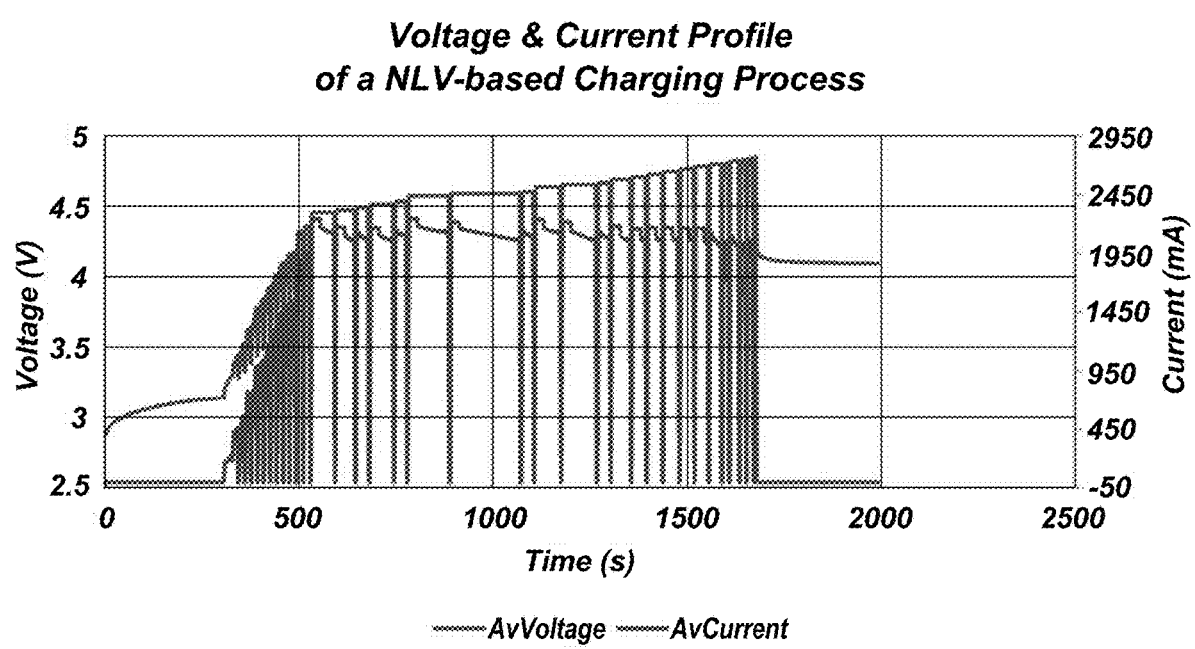
FIG. 2 illustrates Voltage & Current Profiles of a NLV-based Charging Process, FIG. 3 Illustrates an ACP-NLV Charging Protocol: Process Flow.

FIG. 2 shows a profile of Current and Voltage during the NLV charging process. Some steps have taken longer time staying in the same voltage compared to the others. Mostly these steps draw more current without drastically dropping over-time. So, the system is more stable and has the potential to accept more current and transport more charge within the cell. In addition, it is also clear, at the beginning, each voltage-step has given a very short duration and rapidly changed until it starts drawing some high-current. This is also a good example of battling against the high polarization at the lower SOCs [9, 10].

Also, a frequent relaxation has applied during this period. Similar situation can be seen at the end where the steps were frequently changed with multiple-relaxations, this is when the Drawn High Current is not that stable and tend to drop very rapidly.

Figure 3:
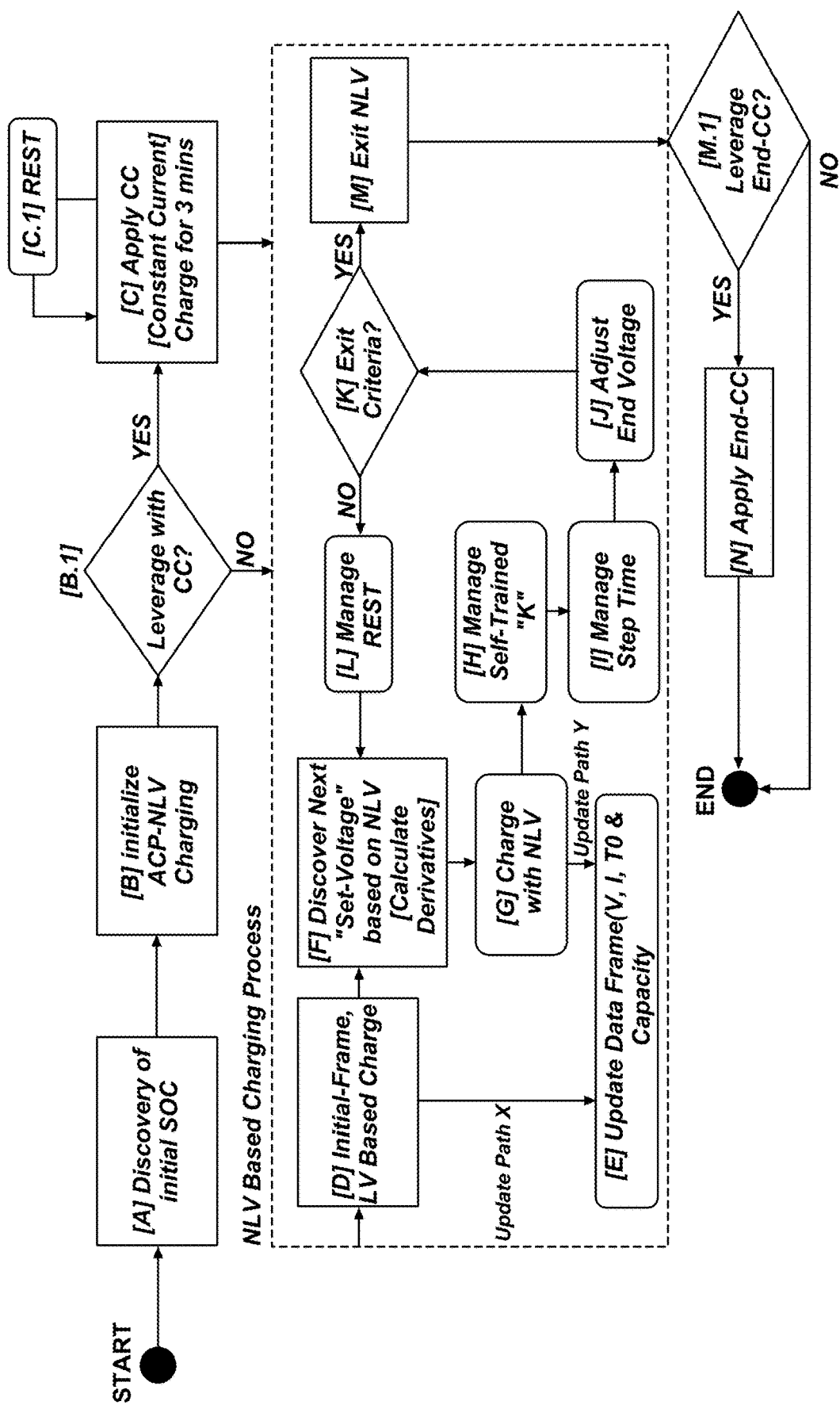

FIG. 3 shows the NLV based charging process as a flow diagram of important processes. Followings section will explain the details of each of these main processes.

[A] Discovery of Initial SOC

Figure 4:
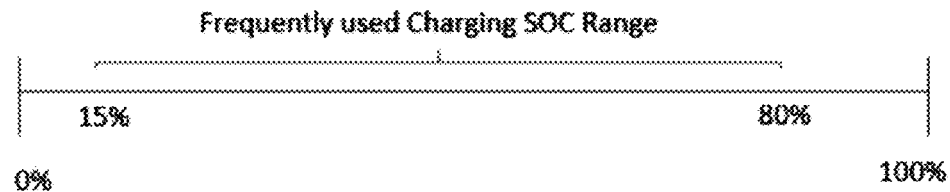
FIG. 4 is a Potential range of Initial SOC.

This is an optional process as the system depends on the SOC gain. Having this measured using any external methods will also help the system to improve its performance. Therefore, several methods have been explored to determine the initial SOC. The Thermodynamic based SOC prediction using fuzzy logic is one of the accurate and faster methods, which have been identified. Some other potential methods can also be found in literature in ref [11, 12]. So, the system not only caters the charging from 0% (SOC) to 100% (SOC) but also supports any partial charging. This initial SOC (if available) can also be used to determine the initial "K" value, with reference to FIG. 4.

[B] Initialize ACP-NLV Charging

Initialization parameter of this protocol can be categorized in to two main sections:

1) User Preference Parameters
   a) Expected Time-Duration (ETD) for charging: whether to charge in 15 minutes or 30 minutes or etc.
   b) Enable Constant Current [CC] Leverage: Opting this will enforce the system to use CC based leverage before applying the NLV based charging. But this is optional. The default current for this CC-Charge is 3C and the time duration is 3 minutes. But those are configurable.
2) System Parameters
   a) start Voltage: the OCV of the battery just before charging starts.
   b) nlvStatedCapacity (SC): the manufacturer defined/experimentally proved capacity of the battery. This will be used to calculate the C-Rate.
   c) nlvStepInterval (CST): the duration of a 1 step of charging/nlv changing. The NLV Charging models through a series of short steps. During each step, the next expected voltage is calculated, charged and update the relevant parameters.
   d) nlvStepsPerFrame (CFS): the number of steps to be considered as a Frame The Frame is a set of adjacent steps bundled-up to apply some mathematical formulas (average derivative of I & V) to determine the next potential Voltage. The entire frame will be filled for the very first time by a series of known Linear Voltammetry (LV) based charging steps equivalent to the number of steps within a frame (CFS). Subsequently, after every step (CTS), only the last element of the frame will be updated with the new data and all the other elements will be shifted one place backward, making the first element discarded. This will be carried-out during the entire charging process.

e) frameCurrentArr: the frame array of currents, which will get updated after every step-time (CTS) duration.
   f) frameVoltageArr: the frame array of currents, which will get updated after every step-time (CTS) duration.
   g) nlvInitialSlopeDuration: this is the time duration taken for the Linear Voltammetry (LV) based charging.
   h) lvEquation: the linear equation, which is used to generate the LV values for the very 1st stage [to fill up the 1st Frame] of NLV charging.
   i) nlvEndTarget Voltage: the End voltage for the LV based charging calculations. This is 4.2V by default.
   j) nlvInitVoltArr: the voltage array of frame-size (CFS) with LV based voltage steps
   k) nlvKValue: the 1st/default Kn value to start with [supposed to be predefined by the LV based analysis on the battery]. Later, this will be trained by the system to support faster-charging.
   l) minVoltage & maxVoltage (Vmax, Vmin): the min/max voltages supported by the system for safety purpose.
   m) cRateRealTime: based on the drawn current, the real-time C-Rate will be measured: e.g C-Rate=Current/nlvStatedCapacity
   n) cRateMinExpected: the minimum required C-Rate to expect if the system is to fully charge in ETD time defined above.
   o) cRateDrop Threshold: this is the "Considerable drop of Current" that will be allowed within a single Voltage-step. If the C-Rate drops below this threshold, the system shift to the next step.
   p) nlvElapsedChargeTime: [nlvECT] is the time duration taken for charging at any given time.

[C] Apply CC [Constant Current] Charge for 3 Mins

If this mode is opted, a 3C Constant Current (CC) will be applied for a shorter period to leverage the battery toward fast-charging. The default period is 3 minutes, but both the CC current and this short period is configurable.

While CC charging, a relaxation [C. 1 REST, "0" current for a 1 step-time (CTS)] is applied after every 10th steps. Once, the CC based charging is completed, a longer relaxation (3 CTS) is applied before moving to the next Process.

[D] Initial-Frame. LV Based Charge

This step is used as the initialization/kick-start process for NLV charging. For the NLV process to calculate the next-non-linear-set-voltage, a frame of Current and Voltage values is required. Therefore, as a starting point, some other methods are needed for a very short period (1 frame duration) to charge the battery. This will also gain some capacity, which will push the battery away from the lower SOC stages where a high polarization is hindering the fast charging.

Therefore, any of the following methods are suitable for this kick-start:
- Linear Sweep Voltammetry (LSV) based charging
- Linear Sweep Amperometry (LSA) based charging.
- Constant Current Constant Voltage (CCCV) based charging
- Cascade Pulse Charging Protocol (CPC) described in the PCT application #PCT/IB2018/059705

To simplify the explanation, LSV has been used as the kick-start method:
1. Read the Start-Voltage (V start) of the battery, after the above relaxation.
2. Read the expected initial End Voltage (V init-end) of the battery. This is set to gain more range in high voltage without harming the battery.
3. Use Linear Voltammetry (LSV) & get an array [array-lv] of voltage elements to start the charging process.

$$V\text{ next}=V\text{ start}+\text{time-interval}*V\text{ slope}$$

V slope was taken as to charge the battery in 20 mins time [if ETD=20 mins]
4. Define the following configuration parameters:
   a. Measure Interval (ts)
   b. Step Interval (dt) [CTS by default]
   c. Number of Steps per Frame (frame-size, CFS)
   d. Stated capacity (Capacity-stated)
   e. Maximum Voltage allowed (V max-end)
   f. VoltageFrame array size of "frame-size"
   g. CurrentFrame array size of "frame-size"
5. Take a frame of steps from the LV array
Select a sub-array of "frame-size" elements from "array-lv" as defined in step 3.
6. Start applying Linear Voltammetry based charging through "array-lv" based voltage series, just for a 1 frame of duration. Measure current & voltage at each step & fill into the relevant Frame-arrays. These will be used to calculate the Slope of Change in Current & Voltage.

[E] Update Data Frame (V. T T) & Capacity

Updating the Voltage (V), Current (I), and Temperature (T) should be done after every step. Therefore, for each step, the update is taken place just before triggering the next step. So, the current taken to calculate the Capacity gain is the minimum current during that CTS time frame (2 secs in default case). Further:

From "Update Path X," every time the incoming/new reading will be stored as the next-element in the frame. As the "process D" will be continued only for CFS number of times, the frame will be completely filled with the completion of the "process D."

From "Update Path Y," every new/next reading will be stored as the last element of the frame. All its previous data will be pushed back from 1 position. So, every time the very first item of the frame will be wiped off.

VoltageFrame & CurrentFrame arrays will be filled to store the frame values and will be continuously updated during the charging process.

Figure 5:
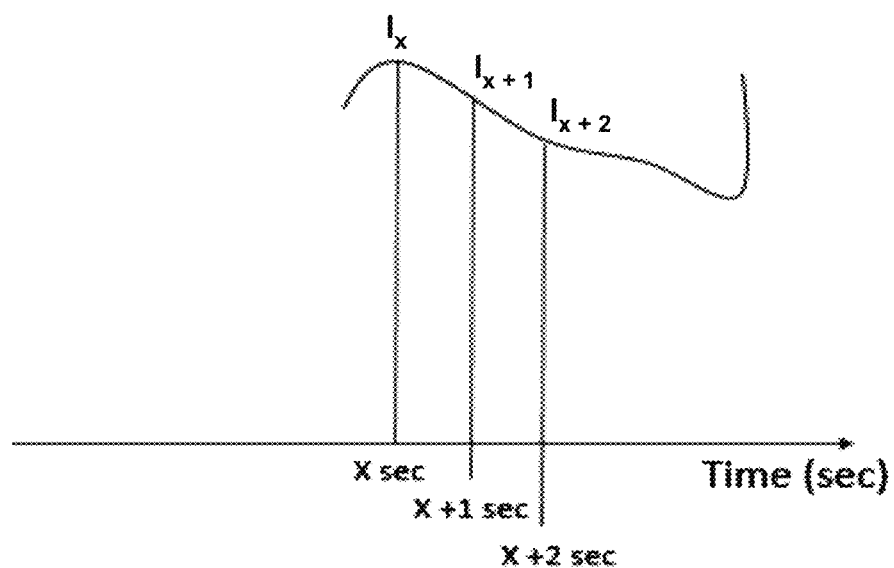
FIG. 5 illustrates a segment of Current Variation with FIG. 6 illustrates the process flow of Training K & StepTime.

Updating the Capacity:

A simple method to calculate the SOC is to use the Coulomb counting in real time:

$$SOC(t) = SOC(0) + 100 \times \frac{\int_0^t I(t)dt}{Q_{nom}}$$

where "I" is the current and "dt" is time duration of a step, with reference to FIG. 5 and $Q_{nom}$ is the nominal capacity of the cell.

The default "Step-time" has set as 2 secs. So, whenever some Current draws by the battery, the relevant capacity gain will be calculated based on the above equation (C=I×t: Current×Time). Then it will be updated to the main capacity-gain. This will be used in the protocol to define the SOC, and subsequently to control over the parameters for changing SOC.

There is no capacity calculation during a relaxation step.

[F] Discover Next "Set-Voltage" based on NLV [Calculate Derivatives]
1. Use the VoltageFrame & CurrentFrame arrays for the following calculation and define the "Next-NLV-based-Voltage" (V-nlv-next).
   a. Calculate the Average of the derivatives of the Current (d[I]/dt (mA/secs)) for the running Frame
   b. Take the last Voltage from the "VoltageFrame" ("V-nlv-prev")
   c. Define the "K-Value"
      i. For the very first time, this will be a predefined value based on the LV analysis for a 20 mins (ETD) LV charge on this type of battery
      ii. For the subsequent processing, the system will train the "K-Value" based on a set of parameters (such as drawn C-Rate, rate of current drop within a step, SOC & etc. This will be described under the section on "Manage Self-Trained "K")."
   d. Define the V-nlv-next as bellow:

$$V\text{-nlv-next}=V\text{-nlv-prev}+K\text{-Value}*[\{I/(d[I]/dt(\text{mA}/\text{secs}))\}*dt]$$

e. Examine the previous NLV-step to identify whether there is a current drop or an increment, & if there is a drop ($I_{drop}=[(I_x+1-I_x)/I_x)]$) then apply a voltage-compensation to reduce the rate of next voltage ramzp.

$$V\text{-nlv-next}=V\text{-nlv-next}-I_{drop}*(V\text{-nlv-next}-V\text{-nlv-prev})$$

2. T, Temperature will also be used to ensure the safety of the battery during charging. Whenever the temperature rises above the safety limit, the charging will be kept on hold and let the system relax for a predefined amount of time duration until resume when the expected temperature range is secured.

[G] Charge with NLV
1. Set the "V-nlv-next" to the battery
   a. Read the Current (realtimeCurrent) & Voltage (real time Voltage) soon after this setting.
   b. Read Current & Voltage after "Step Interval"
   c. Average the above two and update the last entry of the VoltageFrame & CurrentFrame.
2. Read the drawn current soon after setting the V and compare for safety limits to avoid any damages in case of any unexpectedly high current. Otherwise, wait for the CTS duration until the next "NLV-Set-Voltage" is set. There is no enforcement on the Current. The system only measures the Current and Voltage at its finest possible frequency.

[H] Manage Self-Trained "K" & GI1 Manage Step Time $$K_n = \frac{\partial v}{\partial t} \left| \frac{\partial I}{\partial t} \right|$$

Above equation is used to determine the NLV based Set Voltage at every single charge step. But the $K_n$ is also changing based on a set of factors. Following are the main factors used to control it:

"Expected C-Rate: cRateExpected" to ensure fully charge, achieving the required amount of Capacity, within the Required time-duration.

Based on the users' preference/requirement on the "Charge Time" and the "Charge Capacity," the system can calculate the minimum C-Rate ("Expected C-Rate") that has to be maintained continuously or as the average during the entire period of charging. The protocol uses this information to control over the Kn and step time by comparing it with the C-Rate ("Real time C-Rate: cRateRealTime (CRRT)") driven by the real-time-current in every charge step.

Whenever a high "Real time C-Rate" is drawn, the Kn kept as low as possible. And the Step-Time increases as much as possible. At the same time, it will not allow the "Step-Time" to exceed "maximum allowed time for a step" without applying the relaxation. But, if the system draws a high "Real time C-Rate" even after a relaxation, it allows the same Voltage-Step to continue until a "Considerable drop of Current" (this is a configurable parameter by the system) is identified. Then it will decide to move to the next voltage step.

"Elapsed Charge-Time: timeElapsedCharge" to ensure that the required charging is achieved within the expected time duration.

This will also work as a factor of the state of charge (SOC). When it reaches the end segments of the expected charging duration, the system will increase the charging frequency by reducing the Step-time and increases the Kn to a higher value to rapidly sweep through the non-linear voltage change.

But if the system draws a current of nearly or within the range of "Expected C-Rate," the system will keep a nominal range of step-time and Kn value.

"C-Rate draining duration: timeWaitedForExpectedCRate" to try and push the system to get out of such high-resistant charging windows.

Whenever the system detects that the drawing Current at a certain Voltage step is way below the "Expected C-Rate" threshold, it will try to pass through that steps as quickly as possible. Therefore, the "Step-Time" will be reduced.

But, if this occurs at the very initial stage (at Low SOC), the Kn value will be largely increased to step-up the voltage from a large amount.

If it occurs toward the end of charge, the Kn value will kept at a moderate level as the can still have to charge to gain more capacity. Here the expectation of the "C-Rate" can drop down to a half of its full expectation as well.

When the "Step-Time" is reduced in this case, the system tries to speed-up sweeping through charge steps. So, in some cases, the drawn Current may again rise-up. But on other cases, it may remain at a lower C-Rate. In such lower cases, the Kn value will be set to a very high value until a considerably acceptable level of Current could be drawn by the battery. Whenever it start-back drawing high C-Rate current, the Kn value will be lowered, yet the "Step-Time" kept small to pass through this difficult period as fast as possible while gaining the maximum possible charging even within that period.

The control logic and the reference table, which were used for the reference protocol based on the above claims are as follows:

TABLE 1.1

Reference Table for different levels of "cRateExpected"

| Expected C-Rate Threshold Levels | Value | Value for the Reference Protocol shown in this write-up [cRateExpected = 3C, to charge in 20 mins] |
|---|---|---|
| cRateExpectedO5 (CREO5) | cRateExpected + 80% * 1C | 3.8 C |
| cRateExpectedO4 (CREO4) | cRateExpected + 60% * 1C | 3.6 C |
| cRateExpectedO3 (CREO3) | cRateExpected + 30% * 1C | 3.3 C |
| cRateExpectedO2 (CREO2) | cRateExpected + 10% * 1C | 3.1 C |
| cRateExpectedO1 (CREO1) | cRateExpected | 3.0 C |
| cRateExpectedL1 (CREL1) | cRateExpected − 50% * 1C | 2.5 C |
| cRateExpectedL2 (CREL2) | cRateExpected − 90% * 1C | 2.1 C |
| cRateExpectedL3 (CREL3) | cRateExpected − 130% * 1C | 1.7 C |
| cRateExpectedL4 (CREL4) | cRateExpected − 150% * 1C | 1.5 C |

TABLE 1.2

Reference Table for different levels of "nlvKValue_TrainedFactor"

| NLV K-Value Training Factor Levels [Trained K Value = k_T] | Value | Trained_KValueValue for the Reference Protocol shown in this write-up [cRateExpected = 3C, to charge in 20 mins] Default K = 6.4322, "trainedKValue" as "K" below. |
|---|---|---|
| nlvKValue_TrainedFactorL1 (k_TFL1) | 1/16 | K = 0.4020125 |
| nlvKValue_TrainedFactorL2 (k_TFL2) | 1/14 | K = 0.459442857142857 |
| nlvKValue_TrainedFactorL3 (k_TFL3) | 1/12 | K = 0.536016666666667 |
| nlvKValue_TrainedFactorL4 (k_TFL4) | 1/10 | K = 0.64322 |
| nlvKValue_TrainedFactorL5 (k_TFL5) | 1/9 | K = 0.714688888888889 |

TABLE 1.2-continued

Reference Table for different levels of "nlvKValue_TrainedFactor"

| NLV K-Value Training Factor Levels [Trained K Value = k_T] | Value | Trained_KValueValue for the Reference Protocol shown in this write-up [cRateExpected = 3C, to charge in 20 mins] Default K = 6.4322, "trainedKValue" as "K" below. |
|---|---|---|
| nlvKValue_TrainedFactorL6 (k_TFL6) | 2/3 | K = 4.288133333333333 |
| nlvKValue_TrainedFactor (k_TF) | 1 | K = 6.4322 |
| nlvKValue_TrainedFactorH1 (k_TFH1) | 3/2 | K = 9.6483 |
| nlvKValue_TrainedFactorH2 (k_TFH2) | 9 | K = 57.8898 |
| nlvKValue_TrainedFactorH3 (k_TFH3) | 27/2 = 13.5 | K = 86.8347 |
| nlvKValue_TrainedFactorH4 (k_TFH4) | 18 | K = 115.7796 |
| nlvKValue_TrainedFactorH5 (k_TFH5) | 81/4 = 20.25 | K = 130.2505 |
| nlvKValue_TrainedFactorH6 (k_TFH6) | 45/2 = 22.5 | K = 144.7245 |

TABLE 1.3

Reference Table for different levels of "timeWaitedForExpectedCRate"

| The "timeWaitedForExpectedCRate" Levels [t_WFECR] | Number of Steps | Value for the Reference Protocol shown in this write-up [cRateExpected = 3C, to charge in 20 mins] 1-Step Time = 2 secs |
|---|---|---|
| timeWaitedForExpectedCRate_1 (t_WECR1) | 5 | 10 secs |
| timeWaitedForExpectedCRate_2 (t_WECR2) | 8 | 16 secs |

TABLE 1.4

Reference Table for different levels of "timeElapsedCharge"

| The "timeElapsedCharge" stages | As a percentage of SOC | Value for the Reference Protocol shown in this write-up [cRateExpected = 3C, to charge in 20 mins] |
|---|---|---|
| timeElapsedCharge_1 (tEC1) | 20% | 5 Mins |
| timeElapsedCharge_2 (tEC2) | 60% | 10 Mins |

TABLE 1.5

Reference Table for different levels of "stepTimeFactor"

| The "stepTimeFactor" level [t5T = time Step Time] | Value | Value for the Reference Protocol shown in this write-up [cRateExpected = 3C, to charge in 20 mins] StepTime [CTS] = 2 secs |
|---|---|---|
| stepTime_Factor_L1 (tSTFL1) | 1/2 | nlvStepSize = 1 secs |
| stepTime_Factor (tSTF) | 1 | nlvStepSize = 2 secs |
| stepTime_Factor_H1 (tSTFH1) | 5 | nlvStepSize = 10 secs |
| stepTime_Factor_H2 (tSTFH2) | 8 | nlvStepSize = 16 secs |
| stepTime_Factor_H3 (tSTFH3) | 9 | nlvStepSize = 18 secs |
| stepTime_Factor_H4 (tSTFH4) | 10 | nlvStepSize = 20 secs |
| stepTime_Factor_H5 (tSTFH5) | 12 | nlvStepSize = 24 secs |

Figure 6:
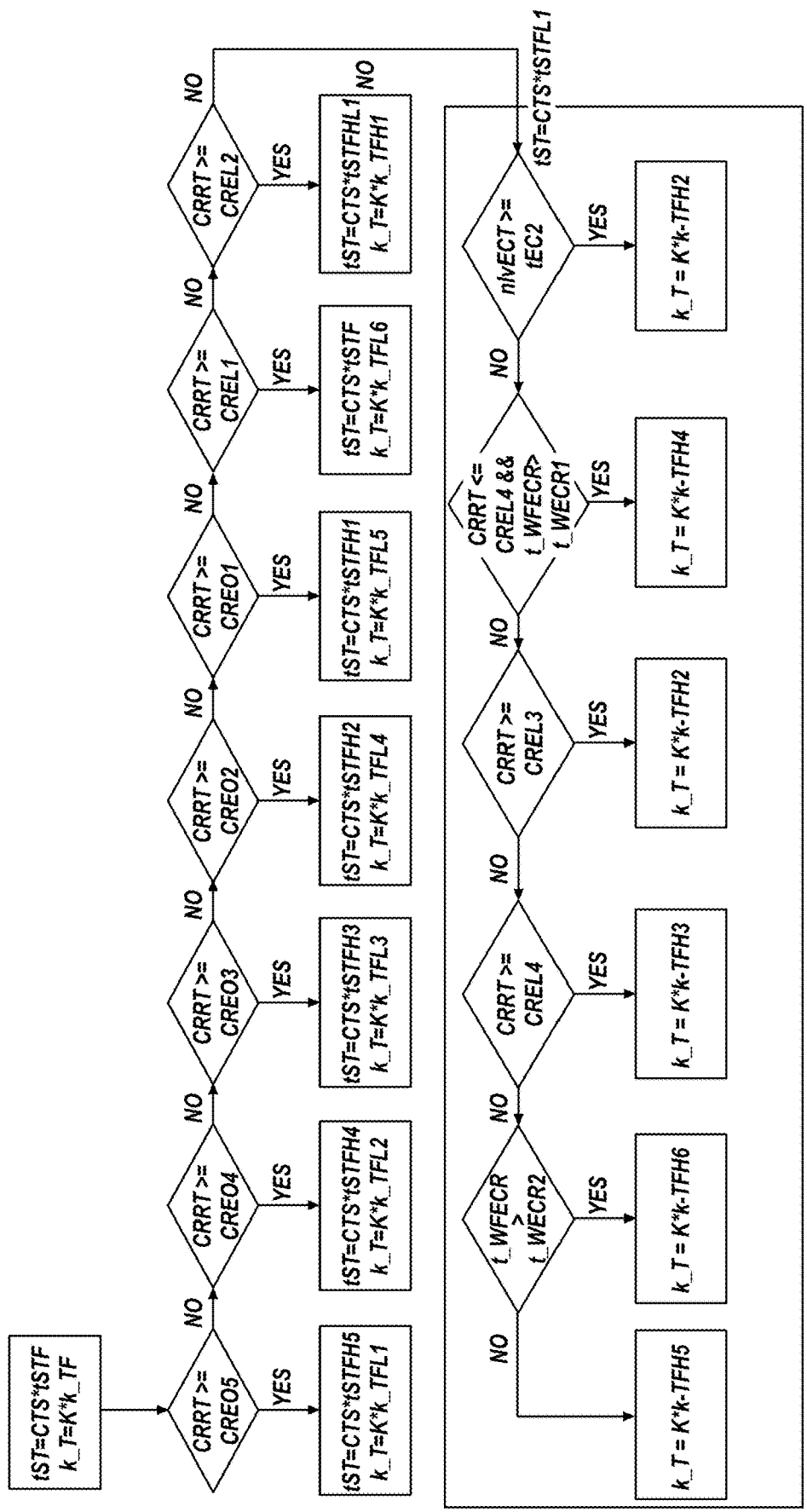
Figure 7:
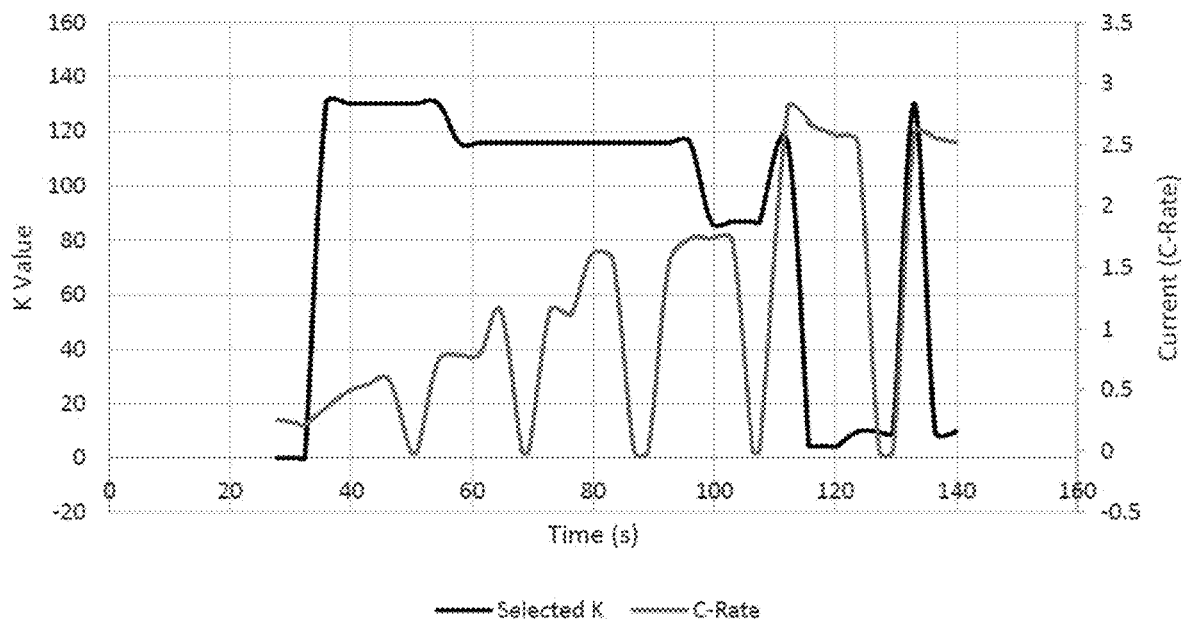
FIG. 7 illustrates an A K-Value profile during the initial part of charging, during first (1-2) mins [@ about 0% SOC]

The flow in FIG. 6 explains how the K-Value & StepTime are controlled based on the parameters shown in the above tables [1.1-1.5]:

As per the FIG. 7, the "Default K (K*k_TF)" & "Default Step Time" will be used only for the very first step in NLV based charging. For all the subsequent steps, the above training algorithm will be applied and find the best suitable "K Value" and "Step Time."

Therefore, it is guaranteed that these parameters get adjusted based on the SOC & SOH of the battery, which causes the possible drawn Current to be different.

As illustrated by FIG. 7, whenever the drawn C-Rate is very low, the K-Value has rapidly increased. Yet, the current has tempted to increase gradually at a space where the battery is capable of handling it.

Also when the C-Rate is high, the K-Value decreases. But the, K-Value decreases to a very low value only when the system tempt to draw a current, which has the C-Rate closer or above the expected C-Rate.

Figure 8:
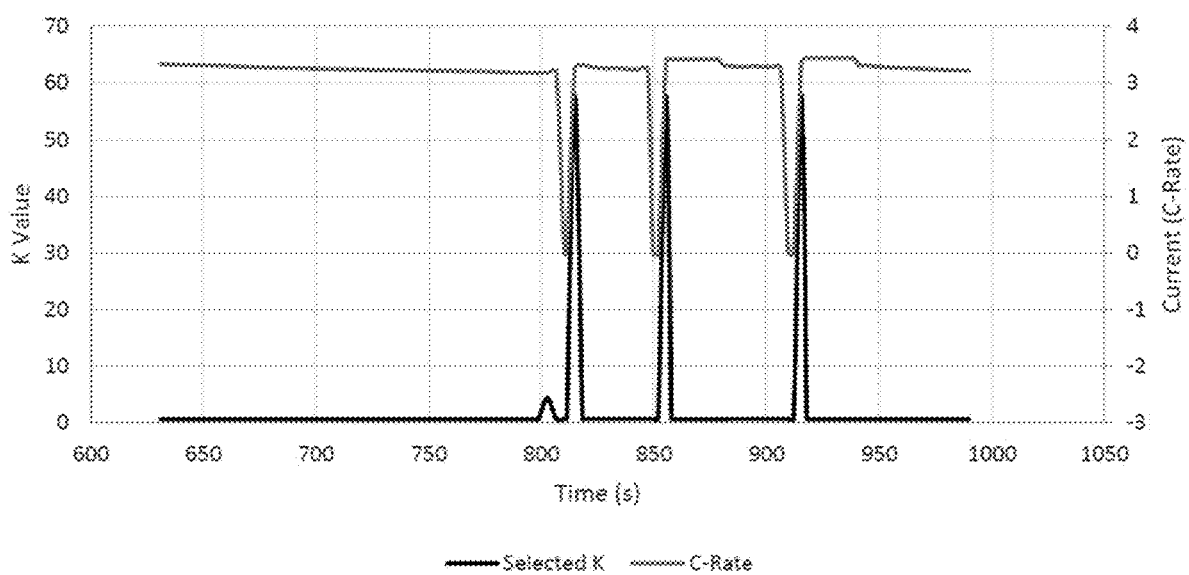
FIG. 8 illustrates an A K-Value profile during the initial part of charging, during (11-16) mins [@ about 40% SOC]

As illustrated by FIG. 8, when the SOC is about half of the full-capacity, the K-Value becomes very low as the battery has a high potential of drawing high Current.

Figure 9:
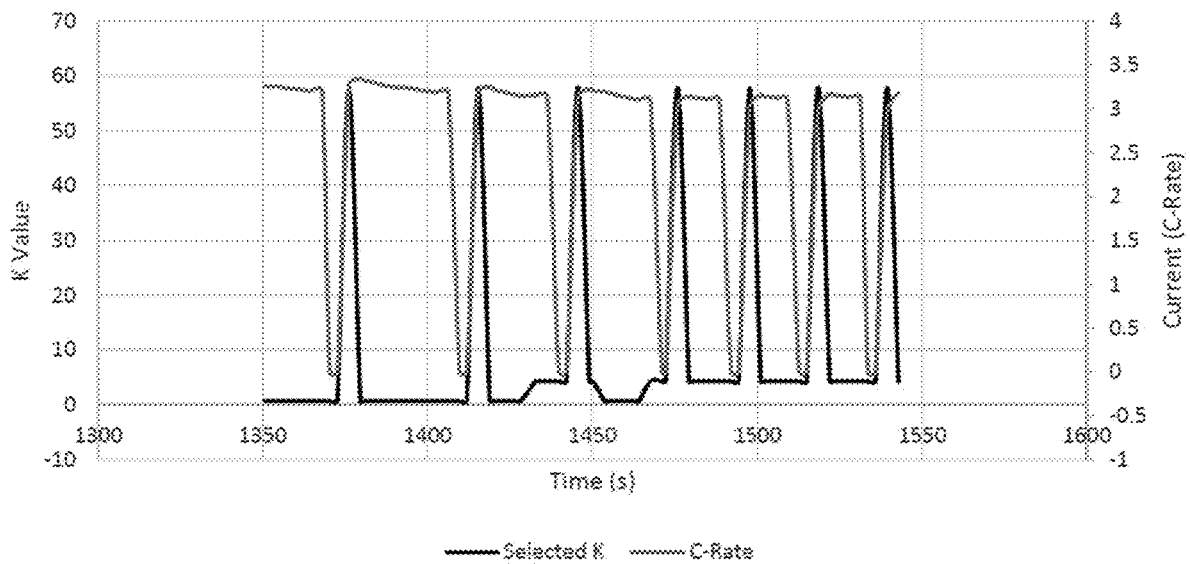
FIG. 9 illustrates an A K-Value profile during the initial part of charging, during (23-25) mins [@ about 95% SOC]

As illustrated by FIG. 9, when the SOC is close to the full-capacity, the K-Value becomes fluctuating rapidly and tries to maintain a high drawing Current.

[J] Adjust the "Target End Voltage"

The idea of having an Adjustable "Target End Voltage" is to enhance the gain capacity depending on its SOC and SOH. Whenever the battery has a good SOH, a major part of the charge capacity can be drawn within a lover voltage range. So, the system sets a "Default Target End Voltage" as an exit point for the NLV charging at the beginning. Whenever the real-time-voltage of the battery reaches this "Default Target End Voltage," the system checks the C-Rate driven by the real-time Current at that time. Then based on this C-Rate, the system determines whether to increase the "Target End Voltage" and continue charging or stop charging at this point. To determine this based on C-Rate, there are two methods considered in the protocol:

The Specific Polarization Profile based Acceptable "Target End Voltage"
  Here the system needs the pre-processed information about the polarization profile of the battery type, which is used as the target for Charging. Therefore, the protocol should be tuned for different battery types.

The Default "Target End Voltage" Table
  This is intended to serve as a universal controller for the End Voltage for any battery type. Also, this table form-up as an average polarization profile, which can be used whenever the "Specific Polarization Profile" is not available for the battery type being targeted for charging. It also intends to train itself based on the charging statistics.

Following table 1.6 is used as the "Default End Voltage Table" for the reference protocol, which was explained here:

TABLE 1.6

The Default End Voltage Table based on empirical data

| C-Rate of the Last Drawn Current (Rounded to an Int) | Adjusted End Voltage [when the Default "End Voltage" = 4.65 V] |
|---|---|
| 1C | 4.65 V |
| 2C | 4.75 V |
| 3C | 4.85 V |

Figure 10:
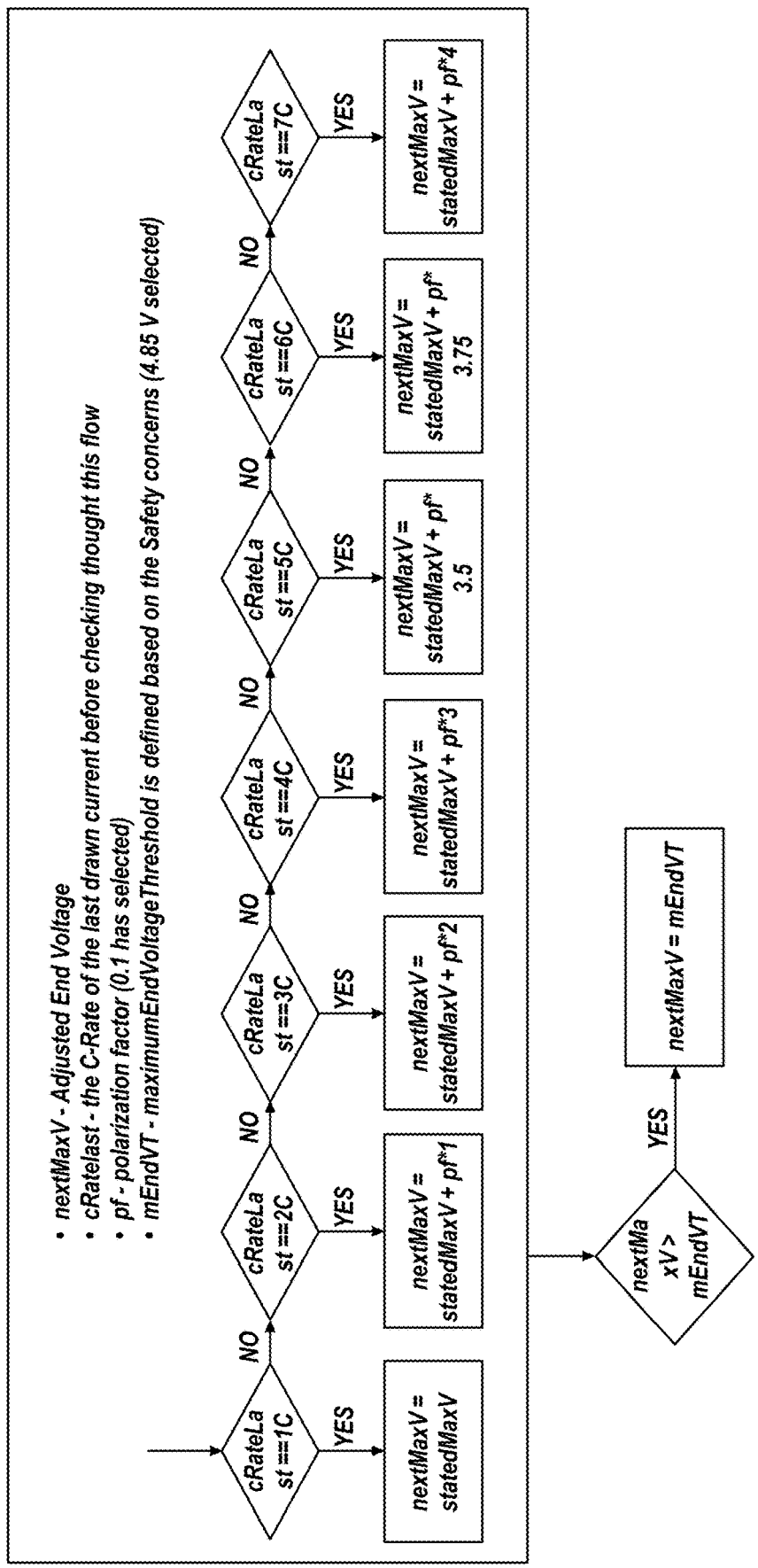
FIG. 10 represents the process flow of controlling "End Voltage,"

Table 1.6, corresponds to the End Voltage values if the "Default End Voltage" was selected as 4.65 V. But this is again a customizable parameter where it can change under system/user preferences. Yet, it is intended to have a range for this based on the battery type/chemistry. Therefore, as a global control logic, handling the "Adjustable End Voltage" can be shown as below, FIG. 10.

[K] Exit Criteria

There are three different criteria to decide on when to stop the charging process.

1. Once the system reached the "Maximum End Voltage"
2. Once the battery gained the required full capacity
3. Learning based Current Profile Comparison If the current profile closely matches with that of any previous current profiles seen during similar exit situations, the learning algorithm intends to improve on its exit profile. Depending on the availability of the above three methods, the same precedence as 1, 2 and 3 will be considered to decide on whether to exit.

[L] Manage REST

Managing the Rest is always applying zero (0) Current to the battery. The charge cycles will pass-over during this Rest period.

[M] Exit NLV

Once at least one criterium is made, the NLV charging will stop. But, depending on how much of a capacity-gain was reached, the system decides whether to go through another round of CC [with 2C constant current charging] or NLV again.

[N] Apply End-CC

Constant Current charging at 2C will be applied during 2 minutes at the end of NLV charging to gain further Capacity if the NLV driven capacity is not sufficient compared to the target. This Constant Current and its Duration is configurable as the system parameters.

Figure 11:
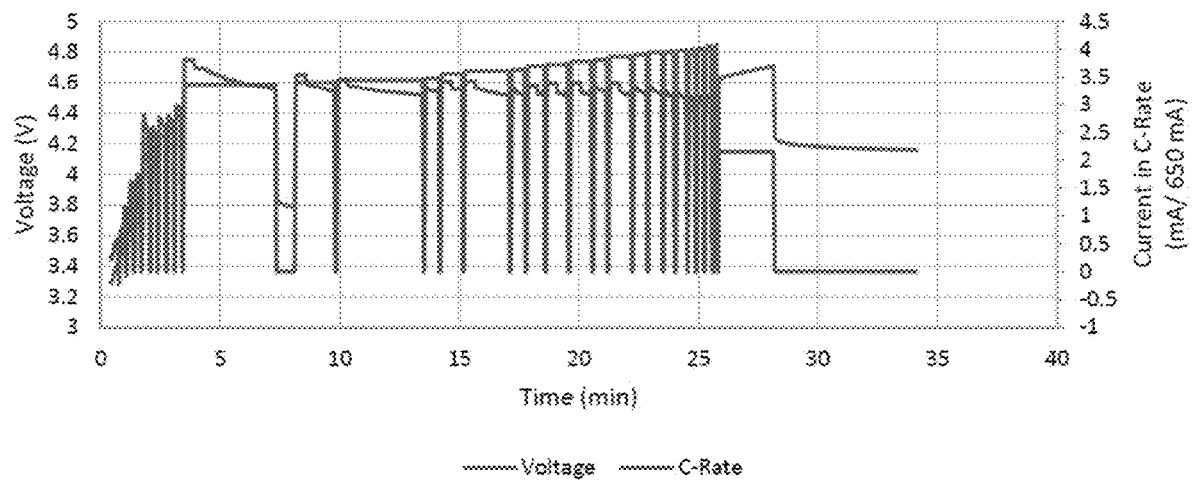
FIG. 11 represents Voltage and Current Profiles of a Random Test 1.
Figure 12:
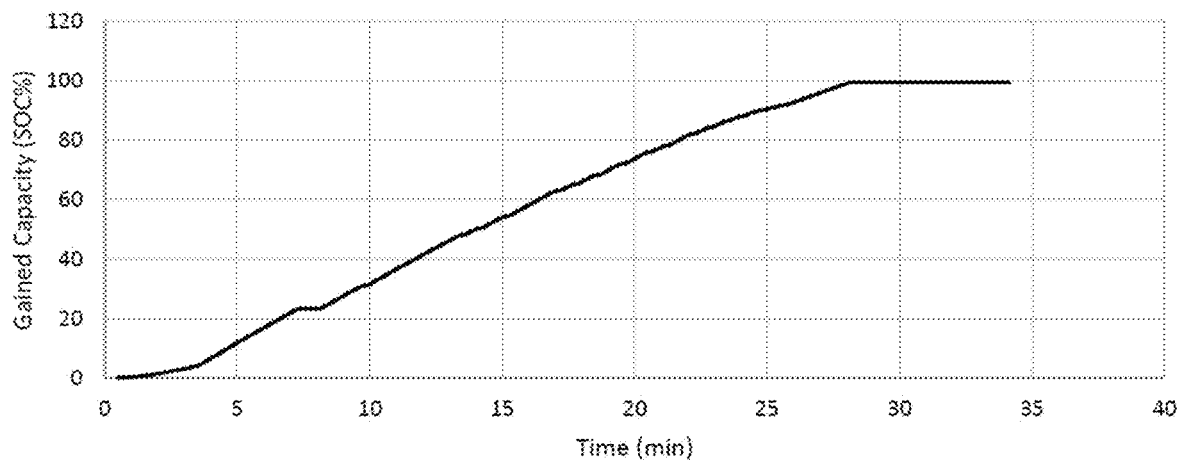
FIG. 12 represents Voltage & Current Profiles of a Random Test 1.

With reference to FIGS. 11 and 12, this is an average profile of the tests, which went up to 24 cycles without any issue, until it is stopped purposely.

Alternatively, the CC protocol, the CCCV protocol and/or the Cascade Pulse Charging protocol (PCT application #PCT/IB2018/059705) can be applied at the beginning of, in the middle of and at the end of the NLV protocol according to the present disclosure.

Multi-Stage k-Value Management

The K-Value is changed based on how best the battery can draw the expected C-Rate of current of above. If, it draws very low C-Rate, the K-Value will be rapidly increasing to model a sudden hike in Voltage and subsequently results in high current. If it draws expected C-Rate or higher, the K-Value changed to a very low and try its best to gain the maximum possible charge with that high-current charging. On other cases, the K-value changed to maintain the expected C-Rate all the time, as much as possible.

Figure 13:
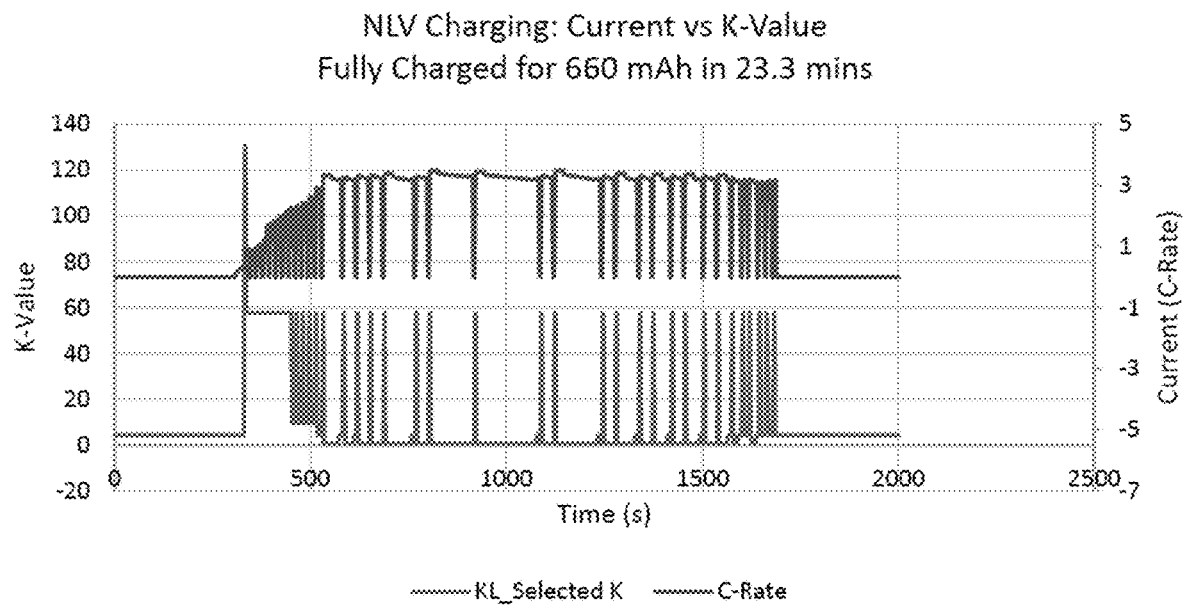
FIG. 13 illustrates NLV Charging: Current vs K-Value during the NLV-Charge ended in Fully Charged up to 660 mAh in just 23.3 mins, Random Test 1.

FIG. 13 illustrates NLV Charging: Current and K-Value vs Time during the NLV-Charge ended in Fully Charged up to 660 mAh in just 23.3 mins, Random Test 1.

Figure 14:
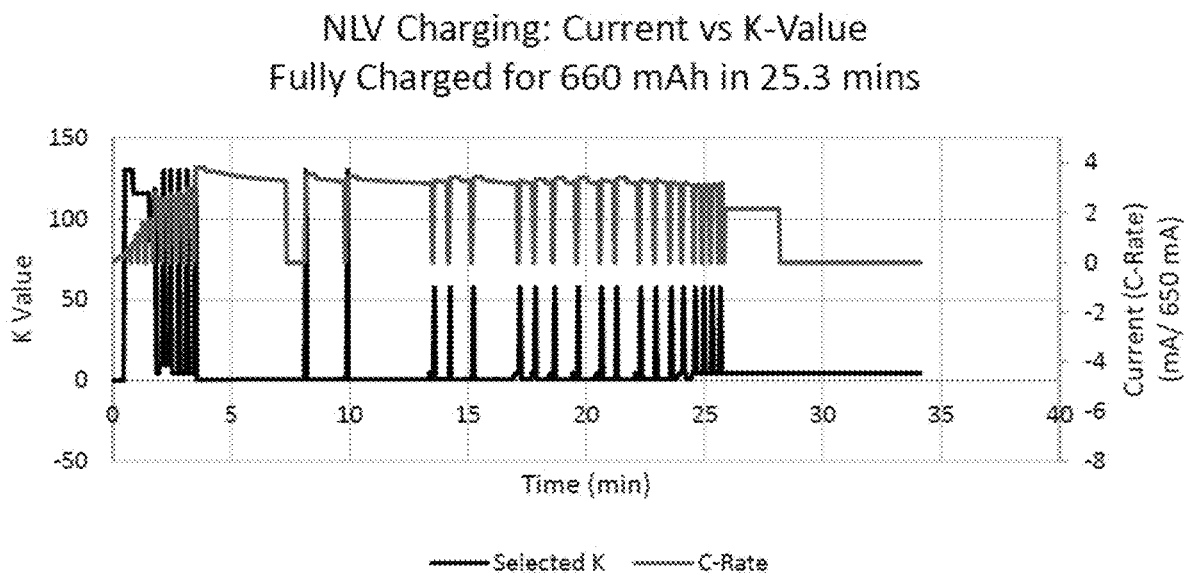
FIG. 14 illustrates NLV Charging: Current vs K-Value during the NLV-Charge ended in Fully Charged up to 660 mAh in just 25.3 mins, Random Test 2.

FIG. 14 illustrates NLV Charging: Current and K-Value during the NLV-Charge ended in Fully Charged for 660 mAh in 25.3 mins, Random Test 2.

Figure 15:
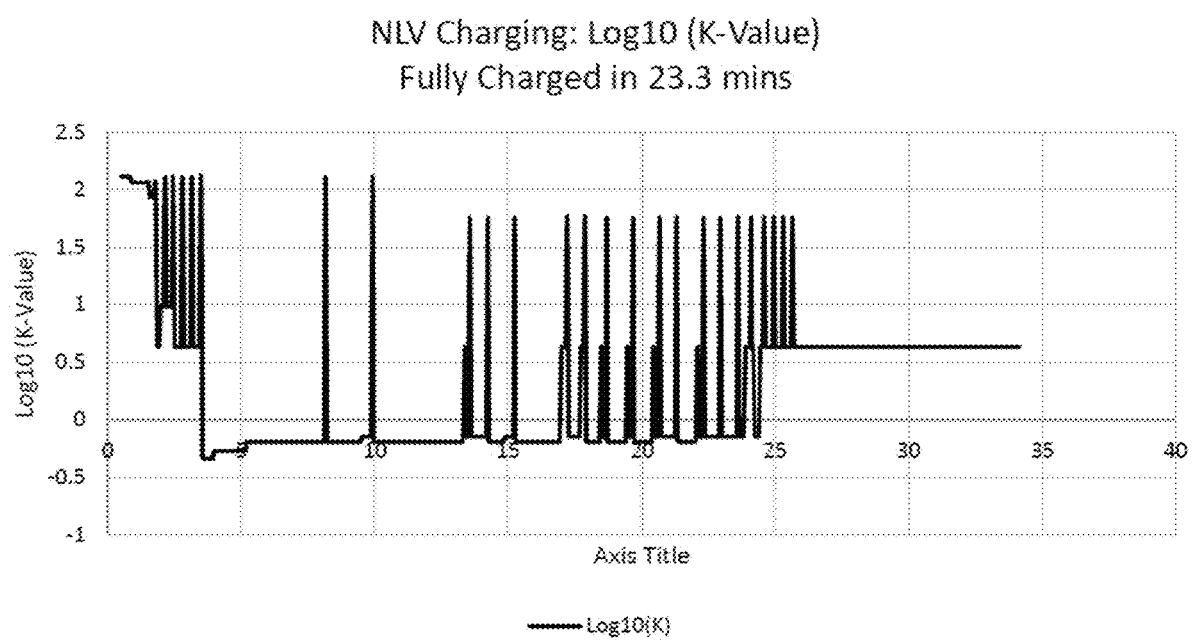
FIG. 15 illustrates a K-Value variation at Log 10 based scale.

A variation of K vs Time in a Logarithmic Scale is represented in FIG. 15.

Figure 16:
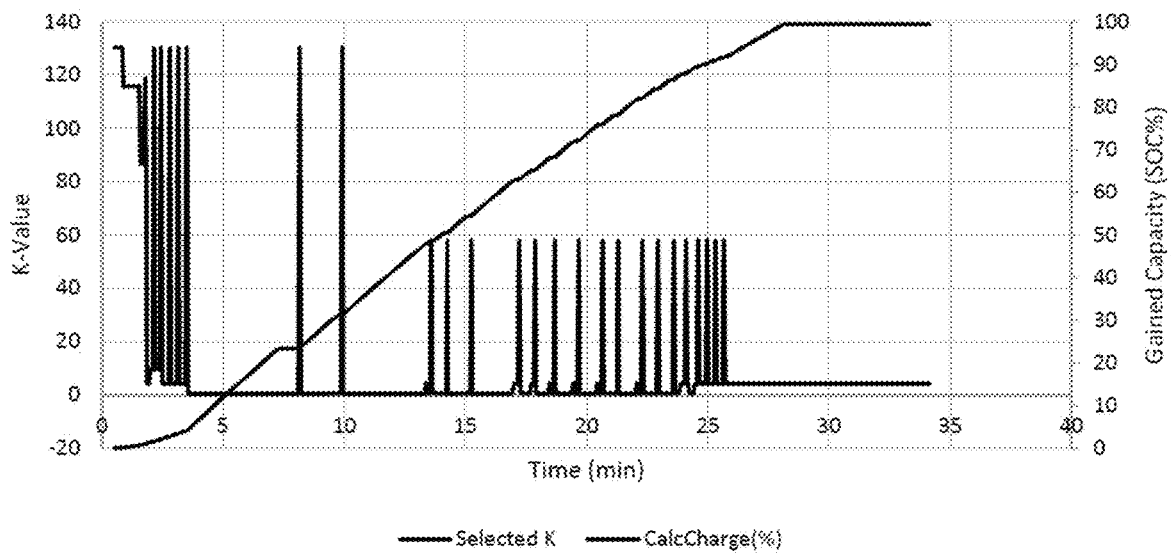
FIG. 16 illustrates NLV Charging: "K-Value" & "SOC" vs Time.
Figure 17:
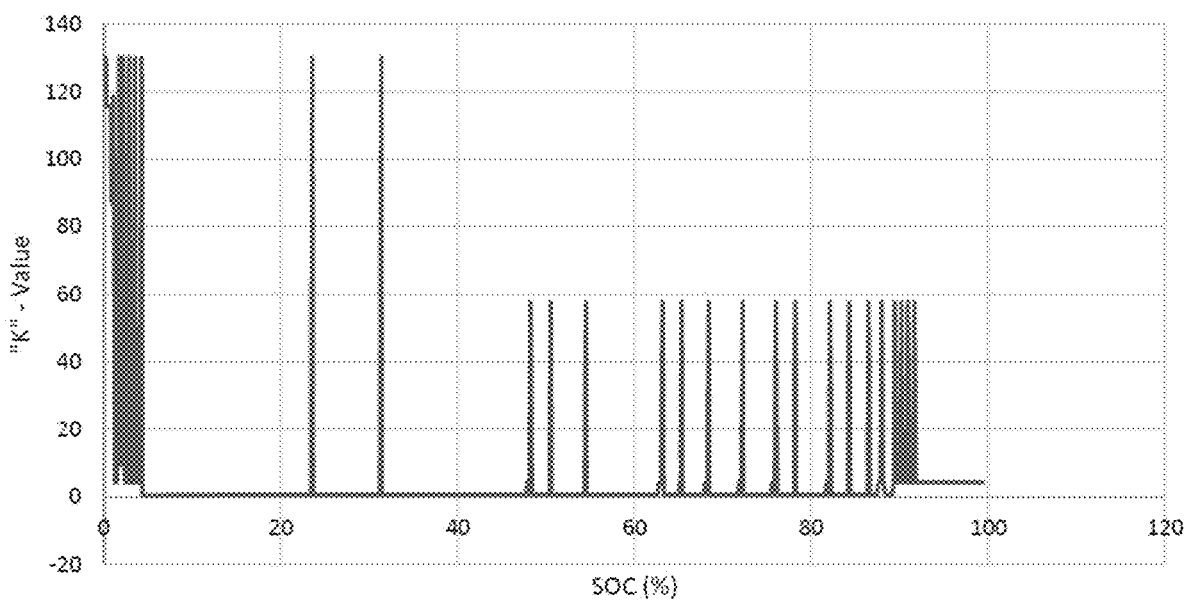
FIG. 17 illustrates "K"-Value vs SOC.

For NLV charging; the variation of "K-value" and SOC vs Time is represented in FIG. 16, while the evolution of "K"-value vs SOC is represented in FIG. 17.

Figure 18:
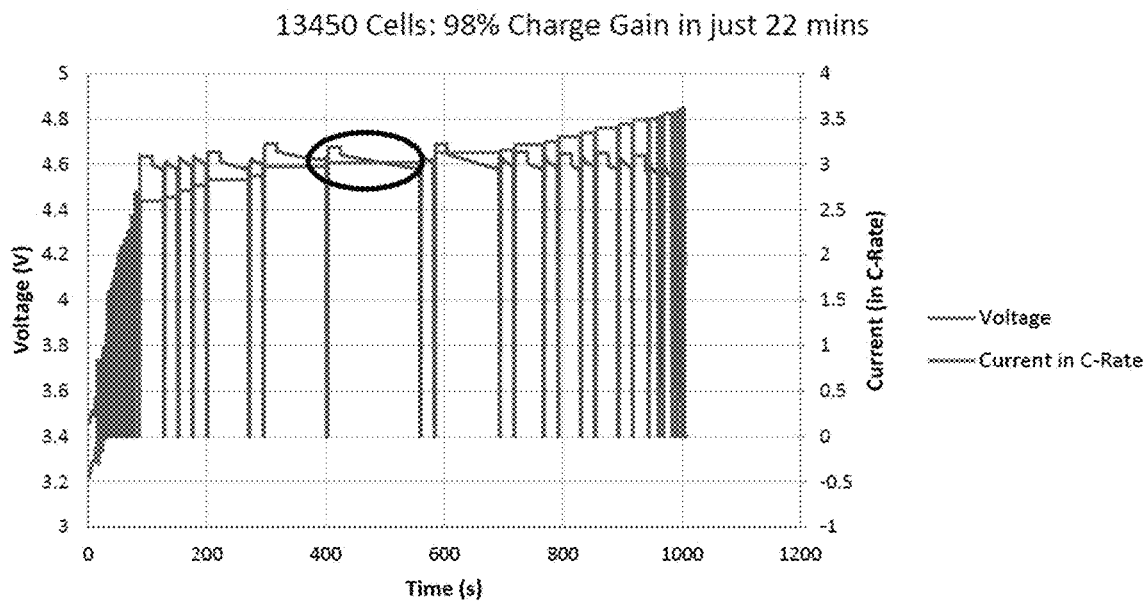
FIG. 18 represents results of a Random Test 3, with 13450 Cells: 98% Charge Gain in just 22 mins.

The graph in FIG. 18 shows the charging-profile of the NLV-based adaptive charging protocol applied to 13450 cells. This has charged a battery of 700 mAh stated-capacity in just 28 mins up-to 99% charge with a gained-capacity of 695 mAh.

During the process,
it has gained over 2C based charge during a half of its process.
also a quarter of its full charging time was drawing the current above 3C & this has occurred at the very end.

The highlighted segment was further analyzed to envisage the workings in the protocol.

Figure 19:
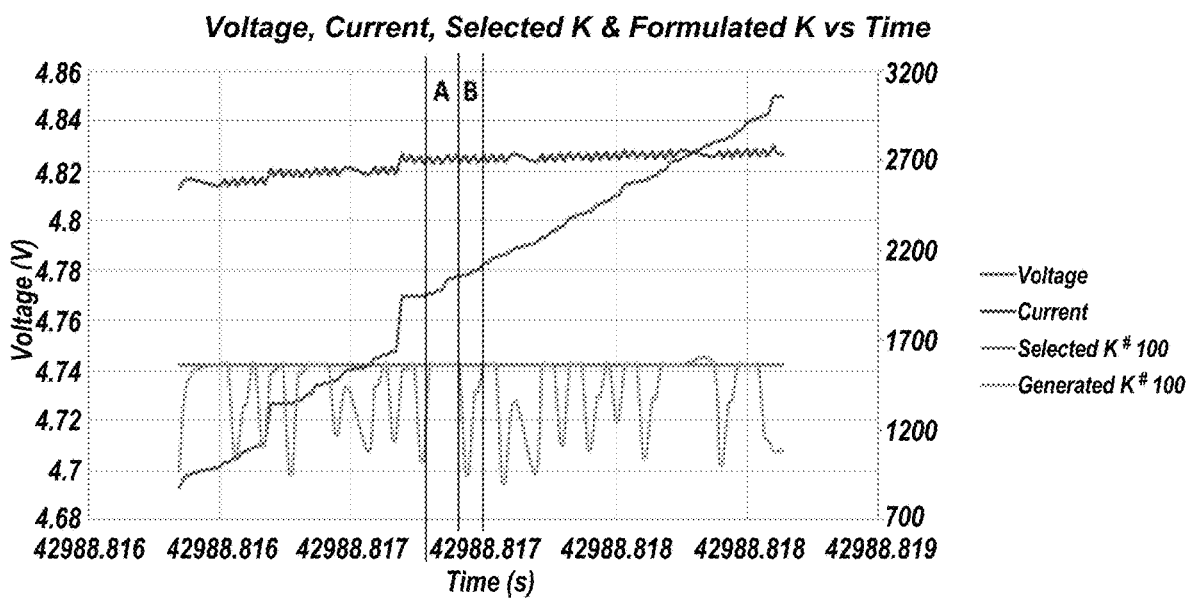
FIG. 19 represents K-Value Voltage ramp compensation over a drop of current.

Analyzing around 100 samples from the highlighted section in FIG. 19:

Selected K: This is the K that was pre-selected and injected to the ACP
Generated K: This is the K that was re-calculated based on the derived "V-nlv-next" using the above K.
Both of the above K has multiplied from 1000 to show-up the variation clearly in the following graph.
As shown in the next section, this variation seen in the "Generated K" vs "Selected K" is due to the precision error as the Voltage rise is always in a very small amounts (mV).

The A & B segments shown above have examined closely in the next section:

A: Generated K is the same as the Selected K during this period
B: Generated K has deviated from the Selected K during this period.

Above "B" segment shown in the rectangular frame in the following table.

The "AVG (Abs (dI/dt))" & "dV/dt" are calculated for respective Current & Voltage variations collected during the charging process.

| | | | Normalization factor | | | | | |
|---|---|---|---|---|---|---|---|---|
| Selected K | K-Generated | AVG (Abs(dI/dt)) | Abs [dI/dt(n − 1)] | Abs [dI/dt(n − 2)] | dV/dt | NLVSet Voltage | Prev Voltage | AVG \|(dI/dt)\| * dv/dt |
| 0.39146667 | 0.391466667 | 223.5 | 141 | 306 | 0.043788218 | 4.772282 | 4.770823 | 0.391466667 |
| 0.39146667 | 0.391466667 | 223.5 | 141 | 306 | 0.043788218 | 4.772282 | 4.770823 | 0.391466667 |
| 0.39146667 | 0.391466667 | 75 | 9 | 141 | 0.130488889 | 4.776632 | 4.772282 | 0.391466667 |
| 0.39146667 | 0.391466667 | 75 | 9 | 141 | 0.130488889 | 4.776632 | 4.772282 | 0.391466667 |

-continued

| | | | Normalization factor | | | | | |
|---|---|---|---|---|---|---|---|---|
| Selected K | K-Generated | AVG (Abs(dI/dt)) | Abs [dI/dt(n − 1)] | Abs [dI/dt(n − 2)] | dV/dt | NLVSet Voltage | Prev Voltage | AVG \|(dI/dt)\| * dv/dt |
| 0.39146667 | 0.391466667 | 286.8 | 564.6 | 9 | 0.034123663 | 4.77777 | 4.776632 | 0.391466667 |
| 0.39146667 | 0.391466667 | 286.8 | 564.6 | 9 | 0.034123663 | 4.77777 | 4.776632 | 0.391466667 |
| 0.39146667 | 0.239325867 | 339.6 | 114.6 | 564.6 | 0.017618218 | 4.778357 | 4.77777 | 0.239325867 |
| 0.39146667 | 0.239325867 | 339.6 | 114.6 | 564.6 | 0.017618218 | 4.778357 | 4.77777 | 0.239325867 |
| 0.39146667 | 0.353076267 | 154.8 | 195 | 114.6 | 0.057021361 | 4.780258 | 4.778357 | 0.353076267 |
| 0.39146667 | 0.353076267 | 154.8 | 195 | 114.6 | 0.057021361 | 4.780258 | 4.778357 | 0.353076267 |
| 0.39146667 | 0.391466667 | 127.2 | 59.4 | 195 | 0.076939203 | 4.782822 | 4.780258 | 0.391466667 |
| 0.39146667 | 0.391466667 | 127.2 | 59.4 | 195 | 0.076939203 | 4.782822 | 4.780258 | 0.391466667 |
| 0.39146667 | 0.391466667 | 139.8 | 220.2 | 59.4 | 0.070004769 | 4.785156 | 4.782822 | 0.391466667 |
| 0.39146667 | 0.391466667 | 139.8 | 220.2 | 59.4 | 0.070004769 | 4.785156 | 4.782822 | 0.391466667 |

| | 1 FrameCurrent Element 1 | 2 FrameCurrent Element 2 | 3 FrameCurrent Element 3 | 4 FrameCurrent Element 4 | 5 FrameVoltage Element 1 | 6 FrameVoltage Element 2 |
|---|---|---|---|---|---|---|
| 1 | 2689.59 | 2683.65 | 2678.55 | 2676.2 | 4.76951 | 4.76966 |
| 2 | 2689.59 | 2683.65 | 2678.55 | 2676.2 | 4.76951 | 4.76966 |
| 3 | 2683.65 | 2678.55 | 2676.2 | 2676.35 | 4.76966 | 4.76974 |
| 4 | 2683.65 | 2678.55 | 2676.2 | 2676.35 | 4.76966 | 4.76974 |
| 5 | 2678.55 | 2676.2 | 2676.35 | 2685.76 | 4.76974 | 4.77075 |
| 6 | 2678.55 | 2676.2 | 2676.2 | 2685.76 | 4.76974 | 4.77075 |
| 7 | 2676.2 | 2676.35 | 2685.76 | 2683.85 | 4.77075 | 4.77222 |
| 8 | 2676.2 | 2676.35 | 2685.76 | 2683.85 | 4.77075 | 4.77222 |
| 9 | 2676.35 | 2685.76 | 2683.85 | 2680.6 | 4.77222 | 4.77661 |
| 10 | 2676.35 | 2685.76 | 2683.85 | 2680.6 | 4.77222 | 4.77661 |
| 11 | 2685.76 | 2683.85 | 2680.6 | 2681.59 | 4.77661 | 4.77773 |
| 12 | 2685.76 | 2683.85 | 2680.6 | 2681.59 | 4.77661 | 4.77773 |
| 13 | 2683.85 | 2680.6 | 2681.59 | 2685.26 | 4.77773 | 4.77835 |
| 14 | 2683.85 | 2680.6 | 2681.59 | 2685.26 | 4.77773 | 4.77835 |

As seen in the above table, the Current has dropped during this "B" segment, as shown in Row 10 Col 4. Therefore, both the dI & dv has shown a sudden hike or a drop. This has caused the multiplication precisions to make a deviation in their product.

Comparison of Charge Capacity & Usable Discharge Capacity

Figure 20:
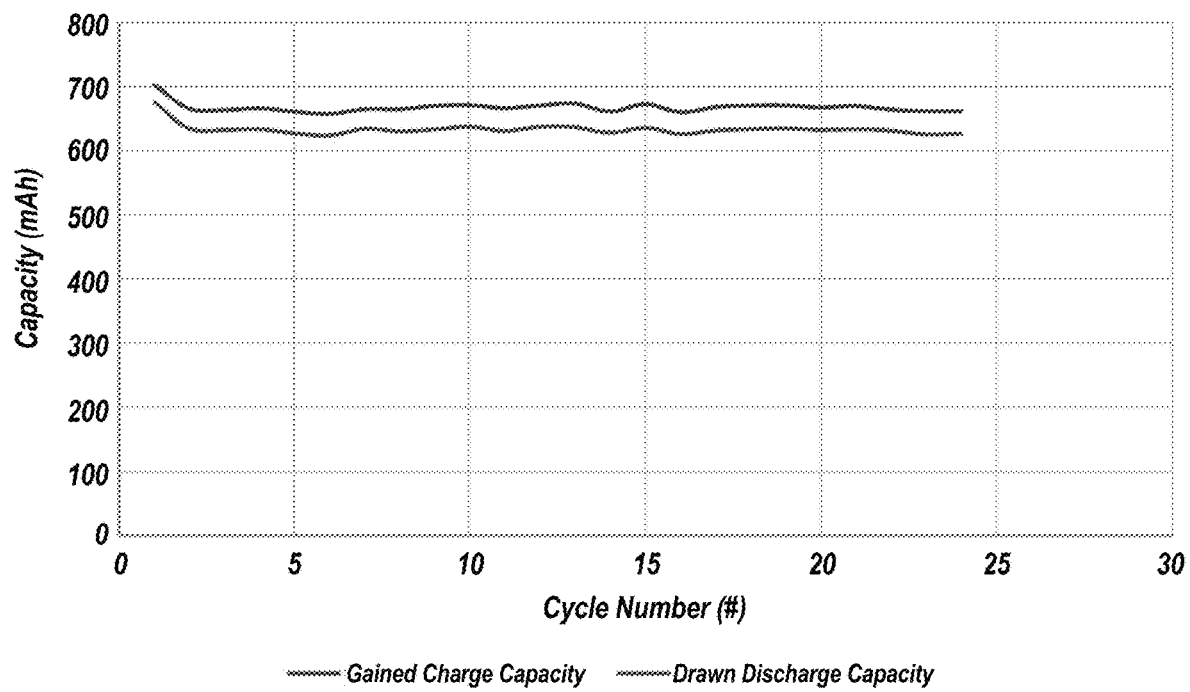
FIG. 20 illustrates Charge Capacity & Discharge Capacity vs Cycle Number during NLV Based Charging, Avg Charge Time @ 23.45 Mins.

FIG. 20 shows that the Discharge capacity maintain almost constant at around 630 mAh, which is about 97% of the stated capacity of the battery. Therefore, it proves that this NLV based charging method doesn't contribute much into capacity fading over time.

Figure 21:
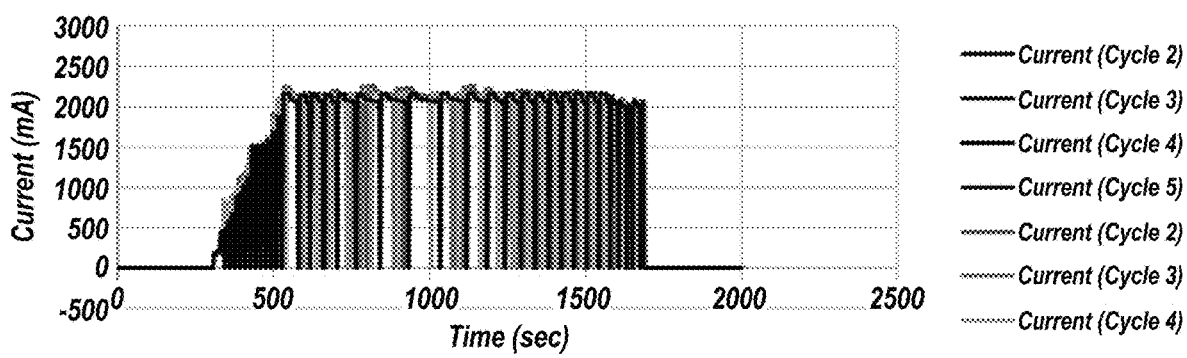
FIG. 21 illustrates Current vs Time During a Number of Charge Cycles using NLV.
Figure 22:
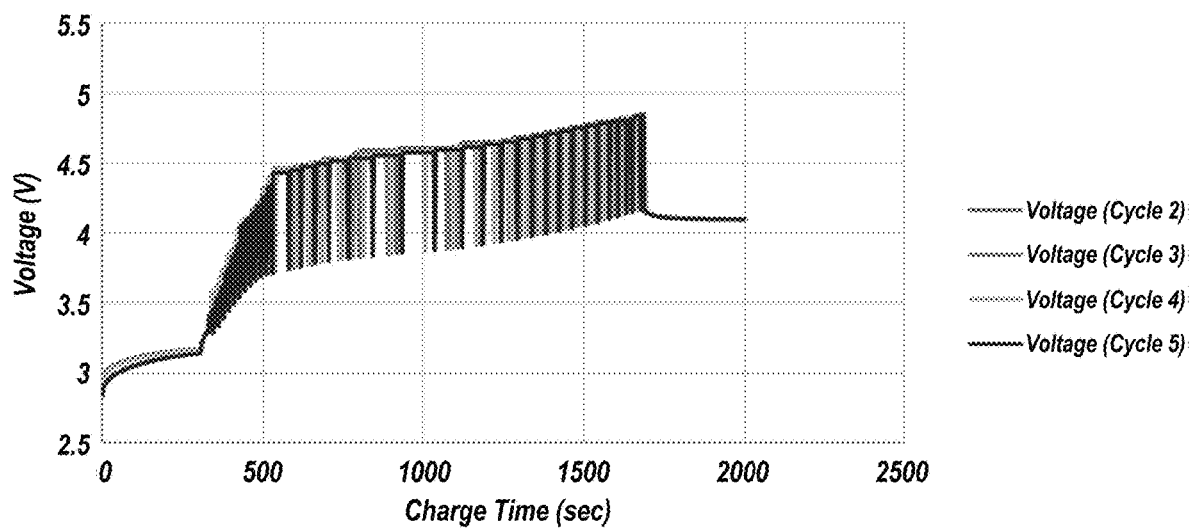
FIG. 22 illustrates Voltage vs Time over a Number of NLV based Charge Cycles.
Figure 23:
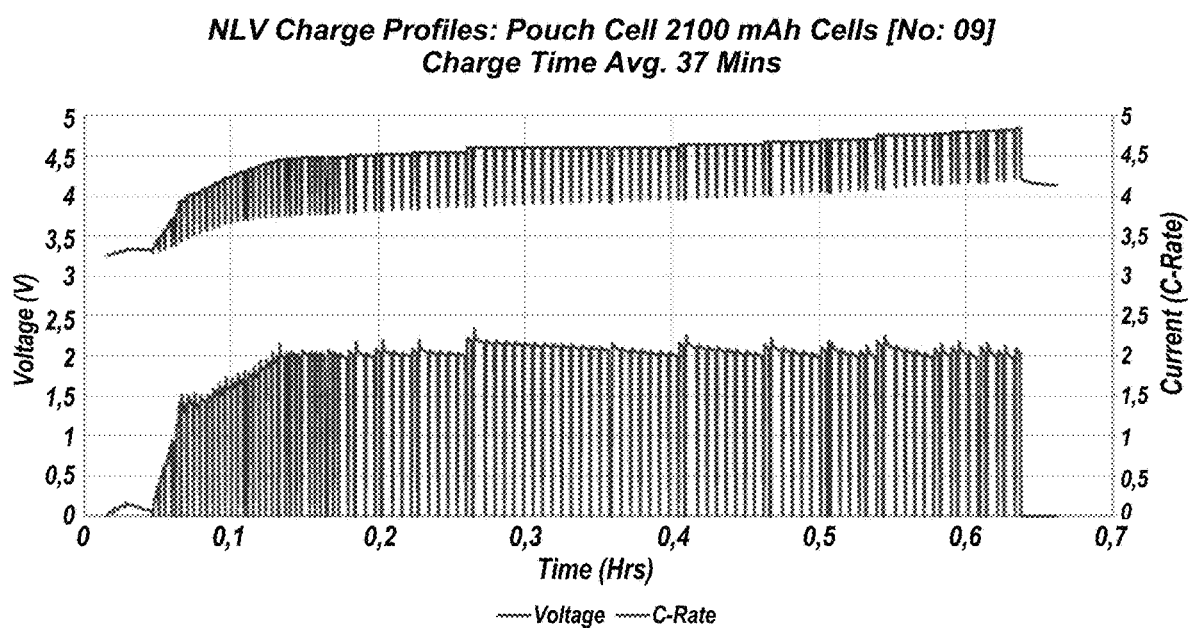
FIG. 23 illustrates NLV Charge Profiles measured for 2100 mAh cells.
Figure 24:
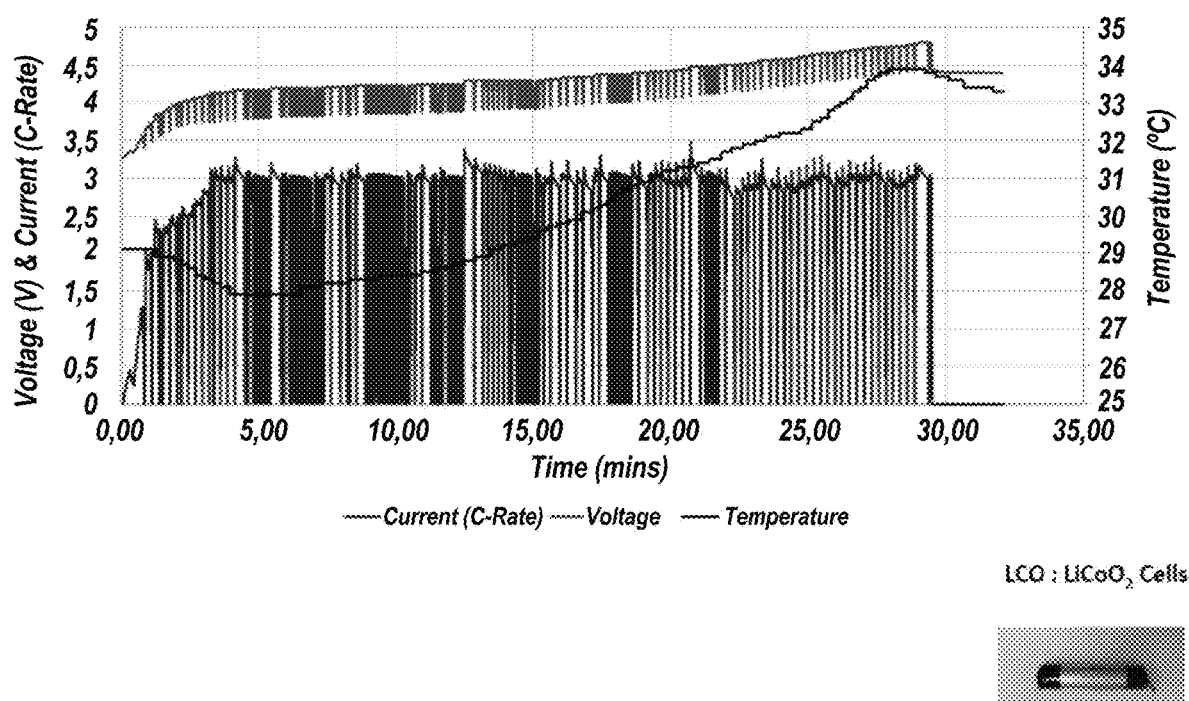
FIG. 24 represents a Temperature Analysis made for LIR 13450 cylindrical cells.
Figure 25:
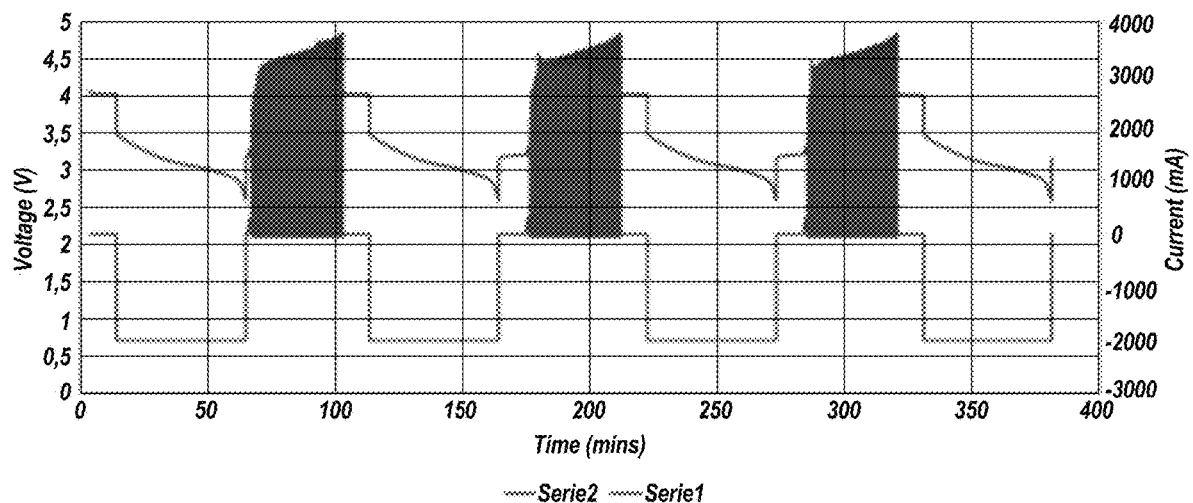
FIG. 25 illustrates NLV-Only Charge/Discharge Profiles with 36 Mins (Avg) duration.
Figure 26:
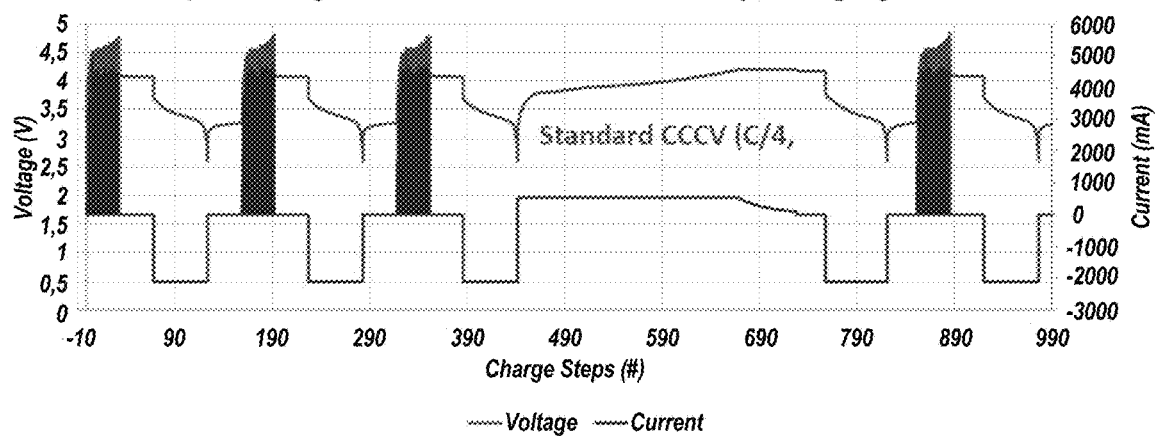
FIG. 26 represents a Daily Charge Schedule with 30 Mins Fast Charging.
Figure 27:
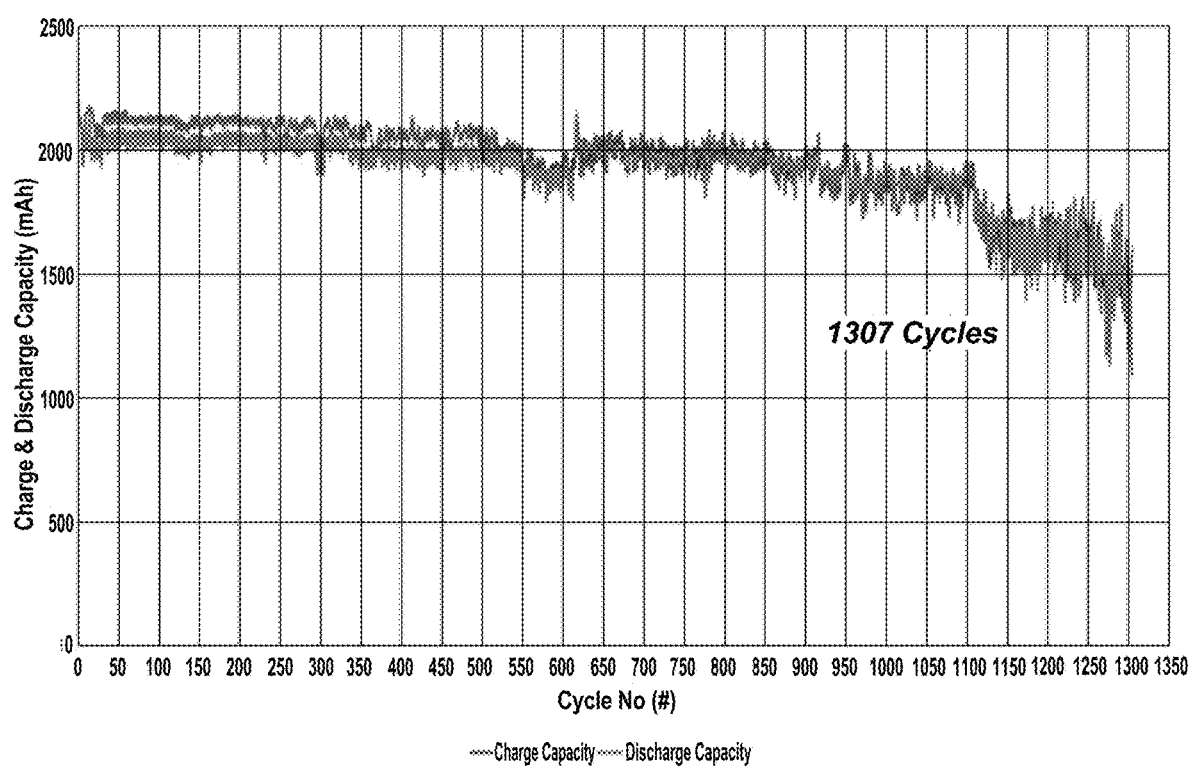
FIG. 27 illustrates the Charge/Discharge Capacity or a cell, with a 36 Mins Charge Time, and FIG. 28 features NLV vs CCCV comparison, with a 30 Mins Charging Time.

This is a very good advantage over other competitive Fast Charging methodologies, which are mostly based on directly imposing high current FIGS. 21 and 22 show that even after multiple cycles of NLV based charging, still the charging profile of current and voltage stays mostly the same. This is another proof to show that the cells are not damaged due to this fast charging process.

Figure 28:
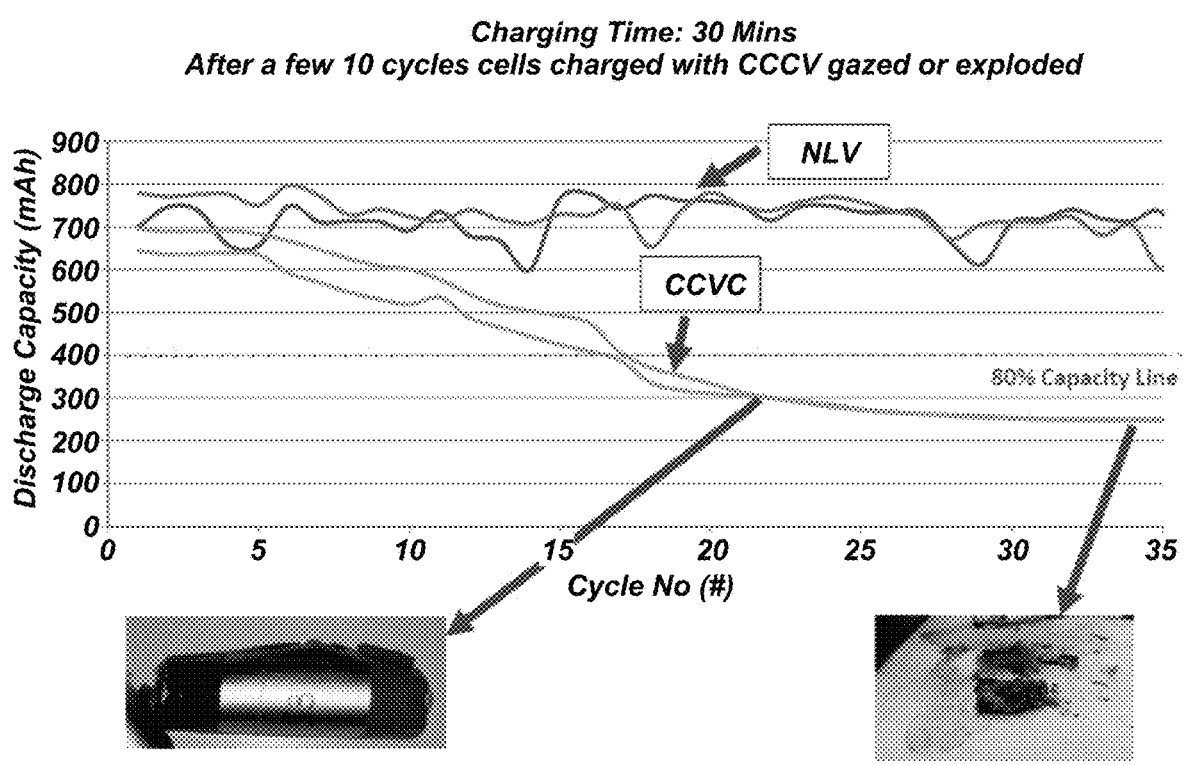

With reference to FIGS. 23 to 28, experimental tests of ACP Charging have been done successfully up to 1300 cycles, with a 30 mins charging time. FIG. 28 more particularly shows that ACP charging is safer than CCCV charging. In fact, after a few ten cycles, the cell charged by CCCV exploded while the cell charged by NLV ACP was preserved.

REFERENCES

[1] S. S Zhang, "The effect of the charging protocol on the cycle life of a Li-ion battery," Journal of Power Sources, Vol. 161, Oct. 27, 2006, pp. 1385-1391.

[2] Ronald Baroody, "Evaluation of rapid electric battery charging techniques," University of Nevada Las Vegas, 2009.

[3] D. Ansean, V. M. Garcia, M. Gonzalez, J. C. Viera, J. C. Anton, C. Blanco, "Efficient fast-charging strategies for Li-ion batteries," University of Oviedo, Gijon, Spain, KINTEX, Korea, May 2015.

[4] Venkatasailanathan Ramadesigan, Paul W. C. Northrop, Sumitava De, Shiram Santhanagopalan, Richard D. Braatz, Venkat R. Subramanian, "Modeling and Simulation of Lithium-Ion Batteries from a Systems Engineering Perspective," Journal of The Electrochemical Society, Jan. 26, 2012.

[5] Elie Ayoub, Nabil Karami, "Review on The Charging Techniques of a Li-ion Battery," University of Balamand, Koura, Lebanon, TAEECE, 2015.

[6] Martin Z. Bazant, "Theory of Chemical Kinetics and Charge Transfer based on Nonequilibrium Thermodynamics," Massachusetts Institute of Technology, Cambridge Mass. 02139, United States, 2012.

[7] Liang He, Eugene Kim, Kang G. Shin, "*-Aware Charging of Lithium-ion Battery Cells," The University of Michigan, Ann Arbor, Mich., USA, 2016.

[8] D. Andrea, "Battery management systems for large Lithium-ion battery packs," Artech House, 2010.

[9] Jiang J C, Zhang C P, Wen J P, et al. "An optimal charging method for Li-ion batteries using a fuzzy-control approach based on polarization properties," IEEE Trans Veh Technol 2013; 62 (7):3000-9.

[10] Jiang J C, Liu Q J, Zhang C P, et al. "Evaluation of acceptable charging current of power Li-ion batteries based on polarization characteristics," IEEE Trans Ind Electron 2014; 61 (12):6844-51.

[11] I.-S. Kim, "The novel state of charge estimation method for lithium-ion battery using sliding mode observer," Journal of Power Sources, 163 (1):584-590, 2006.

[12] X. Hu, F. Sun, Y. Zou, "Estimation of state of charge of a lithium-ion battery pack for electric vehicles using an adaptive luenberger observer," Energies, 2010.

The invention claimed is:

1. A Non-Linear Voltammetry (NLV)-based method for charging a battery system, the method comprising iterations for charging the battery system, each iteration for charging including operations of:
setting the battery system to a certain charging-voltage value which is non-linearly changing and gradually increasing at iterations, during a variable iteration duration,
measuring a current being drawn by the battery system, to determine a time-derivative $$\frac{\partial I}{\partial t}$$

of charge current and monitor a drop-rate of the current being drawn,
measuring temperature within the battery system,
applying a relaxation with charging kept on hold and at least substantially zero current to the battery system to stabilize with its new charge, whenever the measured temperature rises above a safety limit, for a time duration until resuming when an expected temperature range is secured, and
determining a next charging-voltage value for a next charging iteration, by applying for a previous iteration duration a time-derivative of voltage $$\frac{\partial v}{\partial t}$$

that is calculated from the following equation:

$$K_n = \frac{\partial v}{\partial t}\left(\frac{\partial I}{\partial t}\right)^\alpha$$

where:
$K_n$ is changed at iterations, based on a set of parameters including a State of Charge (SOC) and a State of Health (SOH) of the battery system;
α is an adjustable constant, to match non-linear relations between current and voltage based on different types of battery, and
∂I/∂t is an average value of a time derivative of the drawn current during the previous charging iteration.

2. The NLV-based method for charging a battery system according to claim 1, wherein a charging time $t_{ch}$ from 0% SOC to 100% SOC is between 10 minutes and 2 hours.

3. The NLV-based method for charging a battery system according to claim 1, wherein the battery system SOC is between 0% and 100%.

4. The NLV-based method for charging a battery system according to claim 1, wherein a battery system charge-discharge cycle number is 200<n<2000.

5. A method of charging a battery system comprising:
charging the battery system by combining the Non-Linear Voltammetry (NLV)-based method according to claim 1, with any one of a Constant Current (CC), Constant Current Constant Voltage (CCCV) and a Cascade Pulse Charging (CPC) protocol.

6. The method of charging a battery system according to claim 5, wherein any one of the CC protocol, CCCV protocol and CPC protocol is applied at the beginning of, in the middle of, and at an end of the NLV-based method.

7. The NLV-based method for charging a battery system according to claim 1, wherein the method for charging is used on one cell or a multi-cell system in the battery system.

8. The NLV-based method for charging a battery system according to claim 7, wherein the method for charging is used on the multi-cell system in the battery system, the multi-cell system being arranged in series and/or in parallel cell configuration.

9. The NLV-based method for charging a battery system according to claim 7, wherein a battery system voltage of a cell is between 2V and 5V.

10. The NLV-based method for charging a battery system according to claim 7, wherein a battery system charging current in a cell is between 0 and 10C.

11. The NLV-based method for charging a battery system according to claim 7, wherein a cell temperature T is between −20° C. and +55° C.

12. A Non-Linear Voltammetry (NLV)-based system for charging a battery system, the battery charging system implementing a charging method according to claim 1, the NLV-based system comprising:
means for setting the battery system to a certain charging-voltage value which is non-linearly changing and gradually increasing at iterations, during a variable iteration duration,
means for measuring a current being drawn by the battery system, to determine a time-derivative $$\frac{\partial I}{\partial t}$$

of charge current and monitor a drop-rate of the current being drawn,
means for measuring temperature within the battery system,
means for applying a relaxation with charging kept on hold and at least substantially zero current to the battery system to stabilize with its new charge, whenever the measured temperature rises above a safety limit, for a time duration until resuming when an expected temperature range is secured, and
means for determining a next charging-voltage value for a next charging iteration, by applying for a previous iteration duration a time-derivative of voltage $$\frac{\partial v}{\partial t}$$

that is calculated from the following equation:

$$K_n = \frac{\partial v}{\partial t}\left(\frac{\partial I}{\partial t}\right)^\alpha$$

where:
- $K_n$ is changed at iterations, based on a set of parameters including a State of Charge (SOC) and a State of Health (SOH) of the battery system;
- $\alpha$ is an adjustable constant, to match non-linear relations between current and voltage based on different types of battery, and
- $\partial I/\partial t$ is an average value of a time derivative of the drawn current during the previous charging iteration.

13. The NLV-based system according to claim 12, wherein a charging time $t_{Ch}$ from 0% SOC to 100% SOC is between 10 minutes and 2 hours.

14. The NLV-based system according to claim 12, wherein the battery system SOC is between 0% and 100%.

15. The NLV-based system according to claim 12, wherein a battery system charge-discharge cycle number is 200<n<2000.

16. The NLV-based system according to claim 12, wherein the battery system comprises one cell or a multi-cell system.

17. The NLV-based system according to claim 16, wherein the multi-cell system is arranged in series and/or in parallel cell configuration.

18. The NLV-based system according to claim 16, wherein a battery system voltage of a cell is between 2V and 5V.

19. The NLV-based system according to claim 16, wherein a battery system charging current in a cell is between 0 and 10C.

20. The NLV-based system according to claim 16, wherein a cell temperature T is between −20° C. and +55° C.

* * * * *

UNITED STATES PATENT AND TRADEMARK OFFICE
CERTIFICATE OF CORRECTION

PATENT NO. : 11,848,427 B2
APPLICATION NO. : 16/770568
DATED : December 19, 2023
INVENTOR(S) : Rachid Yazami and Thannehene Gedara Thusitha Asela Bandara It is certified that error appears in the above-identified patent and that said Letters Patent is hereby corrected as shown below:

In the Specification

| | | |
|---|---|---|
| Column 1, | Lines 46-47, | change "current, T" to --current, 'i'-- |
| Column 2, | Line 7, | change "value or the" to --value of the-- |
| Column 2, | Line 14, | change "voltages, V" to --voltages, 'v'-- |
| Column 2, | Line 20, | change "voltages, V" to --voltages, 'v'-- |
| Column 4, | Line 22, | change "at Log 10 based" to --at Log10 based-- |
| Column 9, | Lines 31-32, | change "from "array-Iv" as" to --from "array-lv" as-- |
| Column 10, | Line 24, | change "type of battery" to --type of battery.-- |
| Column 10, | Line 32, | change "[$\{I/(d[I]/dt$(mA/" to --[$\{l/(d[I]/dt$(mA/-- |
| Column 10, | Line 38, | change "voltage ramzp." to --voltage ramp.-- |

Signed and Sealed this
Twenty-eighth Day of May, 2024

Katherine Kelly Vidal
*Director of the United States Patent and Trademark Office*